(12) United States Patent
Sudo et al.

(10) Patent No.: US 10,305,496 B2
(45) Date of Patent: May 28, 2019

(54) CIRCUIT DEVICE, PHYSICAL QUANTITY MEASUREMENT APPARATUS, ELECTRONIC APPARATUS, AND VEHICLE

(71) Applicant: Seiko Epson Corporation, Tokyo (JP)

(72) Inventors: Yasuhiro Sudo, Chino (JP); Katsuhiko Maki, Chino (JP); Hideo Haneda, Matsumoto (JP); Akio Tsutsumi, Chino (JP); Takashi Kurashina, Matsumoto (JP)

(73) Assignee: Seiko Epson Corporation (JP)

( * ) Notice: Subject to any disclaimer, the term of this patent is extended or adjusted under 35 U.S.C. 154(b) by 14 days.

(21) Appl. No.: 15/715,458

(22) Filed: Sep. 26, 2017

(65) Prior Publication Data

US 2018/0091158 A1 Mar. 29, 2018

(30) Foreign Application Priority Data

Sep. 27, 2016 (JP) ................................. 2016-187913
May 24, 2017 (JP) ................................. 2017-102225

(51) Int. Cl.
| | |
|---|---|
| H03L 7/00 | (2006.01) |
| H03L 7/087 | (2006.01) |
| G04F 10/00 | (2006.01) |
| H03L 7/18 | (2006.01) |
| H03L 7/23 | (2006.01) |

(52) U.S. Cl.
CPC ............ *H03L 7/087* (2013.01); *G04F 10/005* (2013.01); *H03L 7/18* (2013.01); *H03L 7/23* (2013.01)

(58) Field of Classification Search
None
See application file for complete search history.

(56) References Cited

U.S. PATENT DOCUMENTS

| | | | |
|---|---|---|---|
| 7,304,510 B2 | 12/2007 | Matsuta | |
| 7,479,814 B1 * | 1/2009 | Kaviani | .................. H03L 7/087 326/105 |
| 7,830,191 B2 | 11/2010 | Kojima et al. | |

(Continued)

FOREIGN PATENT DOCUMENTS

| | | |
|---|---|---|
| JP | 01-079687 A | 3/1989 |
| JP | 05-087954 A | 4/1993 |

(Continued)

*Primary Examiner* — Lincoln D Donovan
*Assistant Examiner* — Khareem E Almo
(74) *Attorney, Agent, or Firm* — Harness, Dickey & Pierce, P.L.C.

(57) ABSTRACT

A circuit device includes: a time-to-digital conversion circuit to which a first clock signal with a first clock frequency and a second clock signal with a second clock frequency different from the first clock frequency are input and that converts a time difference in transition timings of first and second signals into a digital value; and a synchronization circuit that synchronizes phases of the first and second clock signals. The time-to-digital conversion circuit calculates the digital value corresponding to the time difference by transitioning a signal level of the first signal based on the first clock signal after a phase synchronization timing of the first and second clock signals and compares the phase of the second clock signal to a phase of the second signal having a signal level is transitioned to correspond to the first signal.

18 Claims, 23 Drawing Sheets

(56) References Cited

U.S. PATENT DOCUMENTS

| | | | |
|---|---|---|---|
| 2009/0146711 A1* | 6/2009 | Senda | G09G 3/2096 |
| | | | 327/158 |
| 2014/0055181 A1* | 2/2014 | Chaivipas | H03K 5/26 |
| | | | 327/156 |
| 2014/0240011 A1* | 8/2014 | Hoeppner | H03L 7/08 |
| | | | 327/147 |
| 2018/0088160 A1* | 3/2018 | Maki | G01R 23/10 |
| 2018/0088536 A1* | 3/2018 | Kurashina | H03L 7/18 |
| 2018/0091159 A1* | 3/2018 | Tsutsumi | H03L 7/0812 |
| 2018/0091160 A1* | 3/2018 | Tsutsumi | G04F 10/005 |

FOREIGN PATENT DOCUMENTS

| | | |
|---|---|---|
| JP | 2007-110370 A | 4/2007 |
| JP | 2009-246484 A | 10/2009 |
| JP | 2010-119077 A | 5/2010 |

* cited by examiner

| fr (MHz) | f1 (MHz) | f2 (MHz) | N2 | M2 | N1 | M1 | Δt=\|1/f1-1/f2\| (ps) |
|---|---|---|---|---|---|---|---|
| 101 | 102.01 | 102 | 102 | 101 | 101 | 100 | 0.96 |
| 102 | 189.04 | 189 | 63 | 34 | 139 | 75 | 1.12 |
| 201 | 276.04 | 276 | 92 | 67 | 103 | 75 | 0.53 |

CIRCUIT DEVICE, PHYSICAL QUANTITY MEASUREMENT APPARATUS, ELECTRONIC APPARATUS, AND VEHICLE

BACKGROUND

1. Technical Field

The present invention relates to a circuit device, a physical quantity measurement apparatus, an electronic apparatus, and a vehicle.

2. Related Art

In the related art, there are known time-to-digital conversion circuits that convert times into digital values. Time-to-digital conversion circuits convert time differences between transition timings of first signals (for example, start signals) and second signals (for example, stop signals) into digital values. As examples of circuit devices including such time-to-digital conversion circuits in the related art, known technologies of the related art are disclosed in, for example, JP-A-2009-246484, JP-A-2007-110370, JP-A-2010-119077, and JP-A-5-87954.

In the technologies of the related art of JP-A-2009-246484, JP-A-2007-110370, and JP-A-2010-119077, the so-called vernier delay circuits are used to realize time-to-digital conversion. In the vernier delay circuits, delay elements, which are semiconductor elements, are used to realize the time-to-digital conversion.

JP-A-5-87954 discloses an infinitesimal time measurement device including a first quartz crystal oscillator that outputs a first clock pulse, a second quartz crystal oscillator that outputs a second clock pulse, an edge matching detection circuit, a synchronization counter, a microcomputer, and a transmission time control unit. The edge matching detection circuit detects a synchronization point of the first and second clock pulses. The synchronization counter performs a counting process in synchronization with the first and second clock pulses. The microcomputer calculates an infinitesimal time from a start pulse to a stop pulse based on a value of the synchronization counter. The transmission time control unit outputs the start pulse in accordance with an output of the edge matching detection circuit and values of the synchronization counter and the microcomputer.

In the technologies of the related art of JP-A-2009-246484, JP-A-2007-110370, and JP-A-2010-119077, however, a start signal is input from the outside when a time difference between the start signal and the stop signal is requested. In time-to-digital conversion in which semiconductor elements are used as in JP-A-2009-246484, JP-A-2007-110370, and JP-A-2010-119077, it is easy to improve resolution, but there is a problem that it is difficult to improve precision.

In the technology of the related art of JP-A-5-87954, first and second quartz crystal oscillators are in an independently oscillating state. Therefore, it is necessary for an edge matching detection circuit to detect a synchronization point and realize the time-to-digital conversion. Therefore, there is a problem that circuit processing is complicated, a conversion time is lengthened, or precision degrades.

SUMMARY

An advantage of some aspects of the invention is that it provides a circuit device, a physical quantity measurement apparatus, an electronic apparatus, and a vehicle capable of realizing high performance time-to-digital conversion while spontaneously generating a first signal.

The invention can be implemented in at least the following configurations.

An aspect of the invention relates to a circuit device including: a time-to-digital conversion circuit to which a first clock signal with a first clock frequency and a second clock signal with a second clock frequency different from the first clock frequency are input and that converts a time difference in transition timings of first and second signals into a digital value; and a synchronization circuit that synchronizes the phases of the first and second clock signals, in which the time-to-digital conversion circuit calculates the digital value corresponding to the time difference by transitioning a signal level of the first signal based on the first clock signal after a phase synchronization timing of the first and second clock signals and comparing the phase of the second clock signal to a phase of the second signal of which a signal level is transitioned to correspond to the first signal.

According to the aspect of the invention, the first and second clock signals with the different clock frequencies are input and a process for the time-to-digital conversion is performed to convert the time difference between the transition timings of the first and second signals into the digital value. The phases of the first and second clock signals are synchronized by the synchronization circuit. According to the aspect of the invention, the signal level of the first signal is transitioned, for example, after the phase synchronization timing of the first and second clock signals by the synchronization circuit. When the signal level of the second signal is transitioned to correspond to the first signal, the phases of the second signal and the second clock signal are compared and the digital value corresponding to the time difference is calculated. In this way, the first signal is spontaneously generated and the time-to-digital conversion can be realized. Since the digital value can be calculated through the comparison of the phases of the second signal and the second clock signal while synchronizing the phases of the first and second clock signals at the phase synchronization timing, it is possible to realize high performance time-to-digital conversion. Accordingly, it is possible to provide the circuit device capable of realizing the high performance of the time-to-digital conversion while spontaneously generating the first signal.

In the aspect of the invention, the time-to-digital conversion circuit may transition the signal level of the first signal at each clock cycle of the first clock signal after the phase synchronization timing.

With this configuration, since the digital value corresponding to the time difference can be calculated by transitioning the signal level of the first signal at each clock cycle of the first clock signal, it is possible to realize high performance time-to-digital conversion.

In the aspect of the invention, the time-to-digital conversion circuit may calculate the digital value corresponding to the time difference by comparing the phases of the second clock signal and the second signal of which the signal level is transitioned to correspond to the first signal at each clock cycle of the first clock signal.

With this configuration, since the digital value corresponding to the time difference can be calculated by comparing the phases of the second signal and the second clock signal at each clock cycle of the first clock signal, acceleration of the time-to-digital conversion is achieved.

In the aspect of the invention, the synchronization circuit may synchronize the phases of the first and second clock signals at each phase synchronization timing.

With this configuration, the phases of the first and second clock signals are synchronized at each phase synchronization timing, the signal level of the first signal is transitioned after the phase synchronization timing, and the phases of the second signal and the second clock signal can be compared. Accordingly, it is possible to perform the time-to-digital conversion using the phase synchronization timing as a reference timing, and thus simplification of a process for the time-to-digital conversion or a circuit configuration is achieved.

In the aspect of the invention, the time-to-digital conversion circuit may calculate the digital value corresponding to the time difference by specifying a timing at which a phase anteroposterior relation between the second signal and the second clock signal is switched when the signal level of the first signal is transitioned based on the first clock signal and the signal level of the second signal is transitioned to correspond to the first signal after the phase synchronization timing.

With this configuration, the time-to-digital conversion can be realized with a simple process of specifying the timing at which the phase anteroposterior relation between the second signal and the second clock signal is switched after the phase synchronization timing, and thus the simplification of the process for the time-to-digital conversion or the circuit configuration is achieved.

In the aspect of the invention, the time-to-digital conversion circuit may perform time-to-digital conversion with a resolution corresponding to a frequency difference between the first and second clock frequencies.

With this configuration, by decreasing the frequency difference between the first and second clock frequencies, it is possible to decrease the resolution. Thus, it is possible to realize high resolution time-to-digital conversion.

In the aspect of the invention, the time-to-digital conversion circuit may perform time-to-digital conversion at a resolution $\Delta t$ when a time difference between transition timings of the first and second clock signals at an i-th clock cycle after the phase synchronization timing is set to an inter-clock time difference $TR=i \times \Delta t$.

With this configuration, it is possible to realize the time-to-digital conversion with the resolution $\Delta t$ using the inter-clock time difference $TR=i \times \Delta t$ between the transition timings of the first and second clock signals after the phase synchronization timing.

In the aspect of the invention, the time-to-digital conversion circuit may calculate a digital value corresponding to an inter-clock time difference $TR=j \times \Delta t$ as the digital value corresponding to the time difference when a phase anteroposterior relation between the second signal and the second clock signal is switched at a j-th clock cycle after the phase synchronization timing.

With this configuration, by specifying the clock cycle at which the phase anteroposterior relation between the second signal and the second clock signal is switched after the phase synchronization timing, it is possible to calculate the digital value corresponding to the time difference.

In the aspect of the invention, in the time-to-digital conversion circuit, the first clock signal may be a clock signal generated by employing a first resonator and the second clock signal may be a clock signal generated by employing a second oscillation element.

With this configuration, by performing the time-to-digital conversion using the first and second clock signals generated by the first and second oscillation elements, it is possible to realize time-to-digital conversion with higher precision.

In the aspect of the invention, the time-to-digital conversion circuit may include a signal output unit that outputs the first signal at each clock cycle of the first clock signal based on the first clock signal.

When the signal output unit is included, it is possible to transition the signal level of the first signal at each clock cycle of the first clock signal.

In the aspect of the invention, the time-to-digital conversion circuit may include a counter of which a count value is not updated (e.g., is maintained) when a signal of a result of the phase comparison of the second signal and the second clock signal is at a first voltage level and the count value is updated when the signal of the result of the phase comparison is at a second voltage level, and may calculate the digital value corresponding to the time difference based on the count value of the counter.

With this configuration, by controlling the counting process of the counter using the result of the phase comparison of the second signal and the second clock signal, it is possible to calculate the digital value corresponding to the time difference.

In the aspect of the invention, the time-to-digital conversion circuit may compare the phases of the second signal and the second clock signal by sampling, based on one one of the second signal and the second clock signal, the other signal.

With this configuration, it is possible to determine the phase relation between the second signal and the second clock signal using a voltage level obtained by sampling the other signal based on the one signal.

In the aspect of the invention, a first PLL circuit that synchronizes phases of the first clock signal and a reference clock signal and a second PLL circuit that synchronizes the phases of the second clock signal and the reference clock signal may be included as the synchronization circuit.

With this configuration, by performing the phase synchronization using the first and second PLL circuits, it is possible to raise the incidence of the phase synchronization compared to a case in which the phases of the first and second clock signals are synchronized by one PLL circuit. Thus, it is possible to realize the high performance of the process for the time-to-digital conversion using the first and second clock signals.

In the aspect of the invention, when J is a jitter amount per clock cycle of the first and second clock signals and $\Delta t$ is a resolution of time-to-digital conversion, $J \leq \Delta t$ may be satisfied.

With this configuration, it is possible to prevent a situation in which the precision of the time-to-digital conversion degrades because the jitter amount exceeds the resolution.

In the aspect of the invention, when K is the number of clocks of one of the first and second clock signals during a period between a timing at which a phase of the one clock signal is synchronized with a phase of the other clock signal or a reference clock signal and a timing at which the phases are subsequently synchronized, $J \geq \Delta t/K$ may be satisfied.

With this configuration, it is possible to prevent a situation in which the precision of the time-to-digital conversion degrades due to the resolution as a main cause.

In the aspect of the invention, when K is the number of clocks of one of the first and second clock signals during a period between a timing at which a phase of the one clock signal is synchronized with a phase of the other clock signal or a reference clock signal and a timing at which the phases are subsequently synchronized, $(1/10) \times (\Delta t/K^{1/2}) \leq J \leq 10 \times (\Delta t/K^{1/2})$ may be satisfied.

With this configuration, it is possible to realize the time-to-digital conversion with the resolution in which an influence of the accumulative jitter is considered (taken into account). Thus, high precision time-to-digital conversion is achieved.

Another aspect of the invention relates to a physical quantity measurement apparatus including the circuit device according to the aspect of the invention; a first resonator that generates the first clock signal; and a second oscillation element that generates the second clock signal.

With this configuration, by performing the time-to-digital conversion using the first and second oscillation elements, it is possible to perform a physical quantity measurement process with higher precision.

Another aspect of the invention relates to an electronic apparatus including the circuit device according to the aspect of the invention.

Another aspect of the invention relates to a vehicle including the circuit device according to the aspect of the invention.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment to be described below does not limit the scope of the invention described in the appended claims and all of the configurations described in the embodiment are not requirements of the invention.

1. Circuit Device

Figure 1:
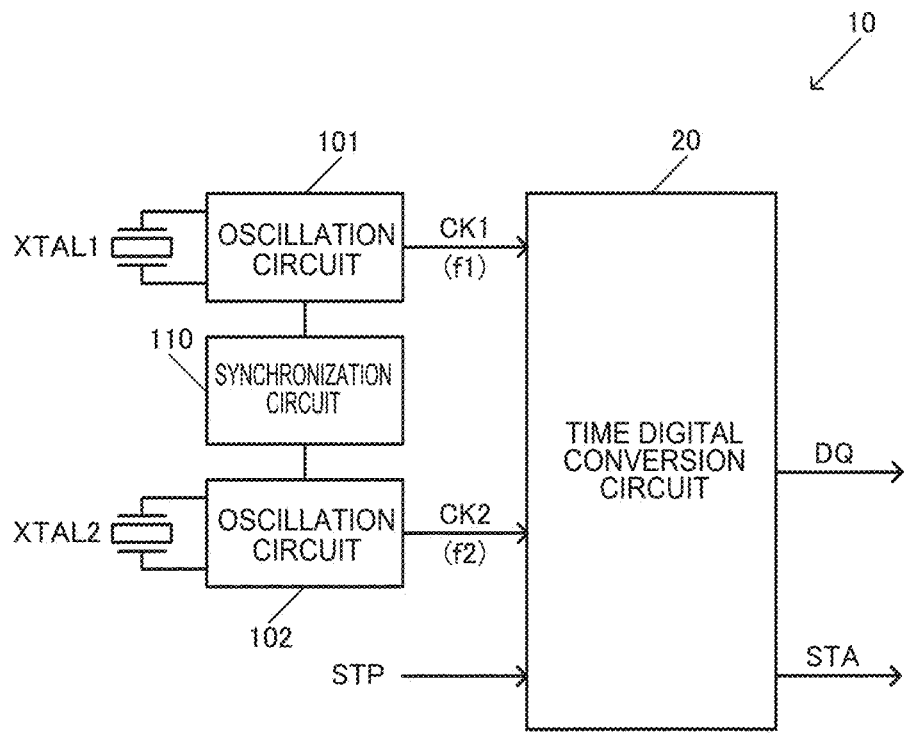
FIG. 1 is a diagram illustrating a configuration example of a circuit device according to an embodiment.

FIG. 1 illustrates a basic configuration of a circuit device 10 according to the embodiment. The circuit device 10 includes a time-to-digital conversion circuit 20 and a synchronization circuit 110. The circuit device 10 can also include oscillation circuits 101 and 102. The circuit device is not limited to the configuration of FIG. 1. Various modifications can be realized in such a manner that some of the constituent elements (for example, the oscillation circuits) are omitted or other constituent elements are added.

The time-to-digital conversion circuit 20 converts a time difference between a signal STA (a first signal such as, for example, a start signal) and a signal STP (a second signal such as, for example, a stop signal) into a digital value DQ. Specifically, a clock signal CK1 (a first clock signal) with a clock frequency f1 (a first clock frequency) and a clock signal CK2 (a second clock signal) with a clock frequency f2 (a second clock frequency) are input to the time-to-digital conversion circuit 20. The time difference between the transition timings of the signals STA and STP is converted into the digital value DQ to be output using the clock signals CK1 and CK2. Here, the clock frequency f2 is a frequency that is different from the clock frequency f1 and, for example, is a frequency lower than the clock frequency f1. A time difference between transition timings of the signals STA and STP is a time difference between edges (for example, rising edges or falling edges) of the signals STA and STP. The time-to-digital conversion circuit 20 may perform a filtering process (a digital filtering process or a lowpass filtering process) on the digital value DQ and outputs the digital value DQ after the filtering process. The time-to-digital conversion circuit 20 may perform the time-to-digital conversion using three or more clock signals with different clock frequencies. For example, first, second, and third clock signals maybe be input and the time difference between the transition timings of the signals STA and STP may be converted into the digital value DQ.

The synchronization circuit 110 synchronizes the phases of the clock signals CK1 and CK2. For example, the synchronization circuit 110 synchronizes the phases of the clock signals CK1 and CK2 at each phase synchronization timing (each given timing). Specifically, the synchronization circuit 110 performs phase synchronization to match the transition timings of the clock signals CK1 and CK2 with each other at each phase synchronization timing. A specific configuration example of the synchronization circuit 110 will be described below.

The time-to-digital conversion circuit 20 transitions a signal level of the signal STA based on the clock signal CK1 after the phase synchronization timings of the clock signals CK1 and CK2. For example, the phases of the clock signals CK1 and CK2 are synchronized by the synchronization circuit 110 and the time-to-digital conversion circuit 20 transitions the signal level of the signal STA using the clock signal CK1 after the phase synchronization timing. For example, the signal level of the signal STA is changed from a first voltage level (for example, an L level) to a second voltage level (for example, an H level). Specifically, the time-to-digital conversion circuit 20 spontaneously generates the signal STA of a pulse signal.

The time-to-digital conversion circuit 20 calculates the digital value DQ corresponding to the time difference by comparing the phases of the signal STP of which the signal level is transitioned to correspond to the signal STA and the clock signal CK2. For example, a timing at which a phase anteroposterior relation between the signal STP and clock signal CK2 is switched is determined through the phase comparison and the digital value DQ is calculated. The timing at which the anteroposterior relation between the phases is switched is a timing at which the phase of one of the signal STP and the clock signal CK2 is switched from a state in which the one signal is behind the other signal in phase to a state in which the one signal is in front of the other signal in phase.

In this way, in the embodiment, the phases of the clock signals CK1 and CK2 are synchronized by the synchronization circuit 110 and the signal STA is spontaneously generated based on the clock signal CK1 after the phase synchronization timing. Then, the phase of the signal STP of which the signal level is transitioned to correspond to the spontaneously generated signal STA is compared to the phase of the clock signal CK2 and the digital value DQ corresponding to the time difference between the transition timings of the signals STA and STP is calculated. In this way, it is possible to realize time-to-digital conversion with high performance (high precision or high resolution) while spontaneously generating the first signal used for the time-to-digital conversion.

For example, in the embodiment, as will be described below with reference to FIG. 2, the time difference between the transition timings of the signals STA and STP is converted into the digital value using a frequency difference ($|f1-f2|$) between the clock signals CK1 and CK2. In this way, compared to the schemes of the related art of the above-described JP-A-2009-246484, JP-A-2007-110370, and JP-A-2010-119077 in which the time-to-digital conversion is realized using delay elements, which are semiconductor elements, the precision of the time-to-digital conversion can be considerably improved. In particular, when the clock signals CK1 and CK2 generated by the oscillation elements XTAL1 and XTAL2 are used, a considerable improvement in the precision can be expected compared to the schemes of the related art.

On the other hand, in the schemes of the related art of the above-described JP-A-2009-246484, JP-A-2007-110370, and JP-A-2010-119077, start and stop signals are input from the outside. In the schemes of the related art, the time-to-digital conversion is realized by a so-called vernier delay circuit. The vernier delay circuit includes, for example, a first delay circuit to which a start signal is input from the outside and which delays a signal, a second delay circuit to which a stop signal is input from the outside and which delays a signal, and a logic circuit that calculates a digital value based on the signals of the first and second delay circuits. The time-to-digital conversion is realized, for example, by setting a delay amount of the delay elements included in the first delay circuit to be greater than a delay amount of the second delay circuit.

However, when the clock signals CK1 and CK2 generated by the oscillation elements XTAL1 and XTAL2 are used, the time-to-digital conversion may not be realized in the schemes of the related art in which the signals STA and STP are assumed to be input from the outside. For example, it takes some time to activate oscillation when an oscillation operation of the oscillation element XTAL1 is started by the oscillation circuit 101 using an input of the signal STA from the outside as a trigger. Therefore, time measurement may be delayed.

Accordingly, in the embodiment, the signal STA is not input from the outside, but rather a scheme of spontaneously generating the signal STA based on the clock signal CK1 is adopted. For example, the clock signals CK1 and CK2 are generated through free-running oscillation operations of the oscillation circuits 101 and 102. The signal level of the signal STA is transitioned using the clock signal CK1 generated through the free-running oscillation operation to spontaneously generate the signal STA of a pulse signal. Then, by comparing the phase of the signal STP of which the signal level is transitioned to correspond to the signal STA as in FIGS. 3 and 4 to be described below to the phase of the clock signal CK2 generated through the oscillation operation, the time-to-digital conversion in which the digital value DQ corresponding to the time difference between the signals STA and STP is calculated is realized.

In this case, when a timing serving as a reference of time measurement is not defined, the problem that circuit processing is complicated, a conversion time is lengthened, or precision degrades may occur as in the scheme of the related art of the above-described JP-A-5-87954.

Accordingly, in the embodiment, the synchronization circuit 110 is included. The phases of the clock signals CK1 and CK2 generated through the oscillation operation are synchronized by the synchronization circuit 110. For example, the phases of the clock signals CK1 and CK2 are synchronized at each phase synchronization timing. In this way, since the time-to-digital conversion can be realized using the clock signals CK1 and CK2 using the phase synchronization timing as a reference timing, the problem of the complication of the circuit processing can be resolved. In addition, by synchronizing the phases of the clock signals CK1 and CK2 at the phase synchronization timing, it is also possible to shorten a conversion time or improving precision. Thus, it is possible to realize high performance time-to-digital conversion.

More specifically, the time-to-digital conversion circuit 20 transitions the signal level of the signal STA at each clock cycle of the clock signal CK1 after the phase synchronization timing. For example, the signal level of the clock signal CK1 is transitioned at each clock cycle (for example, subjected to rising transition or falling transition). However, the signal level of the signal STA is transitioned to be synchronized with the transition of the signal level of the clock signal CK1.

In this way, since the pulse signal of the signal STA used for the time-to-digital conversion can be generated at a short period corresponding to the clock frequency f1 of the clock signal CK1, acceleration of the time-to-digital conversion is achieved. For example, in the scheme of the related art of the above-described JP-A-5-87954, only a one-time start signal is generated through a one-time time measurement. Therefore, there is a problem that the conversion time of the time-to-digital conversion is considerably lengthened. In contrast, according to a scheme of transitioning the signal level of the signal STA at each clock cycle of the clock signal CK1 after the phase synchronization timing, this problem can be resolved and it is possible to realize the acceleration of the time-to-digital conversion.

More specifically, the time-to-digital conversion circuit 20 calculates the digital value DQ corresponding to the time difference by comparing the phases of the clock signal CK2 and the signal STP of which the signal level is transitioned to correspond to the signal STA at each clock cycle of the clock signal CK1. That is, the signal STA is generated based on the clock signal CK1 at each clock cycle and the phases of the signal STP and the clock signal CK2 are compared at each clock cycle.

In this way, the result of the phase comparison of the signal STP and the clock signal CK2 at each clock cycle can be obtained and the digital value DQ corresponding to the time difference can be calculated based on the obtained result of the phase comparison. Accordingly, considerable acceleration of the time-to-digital conversion is achieved.

As will be described in detail below, the synchronization circuit 110 synchronizes the phases of the clock signals CK1 and CK2 at each phase synchronization timing. Then, the time-to-digital conversion circuit 20 transitions the signal level of the signal STA based on the clock signal CK1 at each clock cycle during a measurement period between the first phase synchronization timing and the second phase synchronization timing of the clock signals CK1 and CK2, and then compares the phases of the signal STP and the clock signal CK2 at each clock cycle.

In this way, the phases of the signal STP and the clock signal CK2 can be compared a plurality of times using the signal STA based on the clock signal CK1 during the measurement period between the first and second phase synchronization timings and the measurement process for the time-to-digital conversion can be performed. Accordingly, compared to the scheme of the related art of the above-described JP-A-5-87954 in which the time measurement can be performed only once during a one-time measurement period, considerable acceleration of the time-to-digital conversion is possible.

The process of comparing the phases of the signal STP and the clock signal CK2 is, for example, a process of determining whether the phase of the signal STP is behind or in front of the phase of the clock signal CK2. The phase comparison can be realized, for example, by sampling, based on one of the signal STP and the clock signal CK2, the other signal.

The oscillation circuits 101 and 102 are circuits that oscillate the oscillation elements XTAL1 and XTAL2. For example, the oscillation circuit 101 (a first oscillation circuit) oscillates the oscillation element XTAL1 (a first resonator) to generate the clock signal CK1 with the clock frequency f1. The oscillation circuit 102 (a second oscillation circuit) oscillates the oscillation element XTAL2 (a second oscillation element) to generate the clock signal CK2 with the clock frequency f2. For example, the clock frequencies have a relation of f1>f2.

Each of the oscillation circuits 101 and 102 can include an oscillation buffer circuit (an inverter circuit) installed between one end and the other ends of the oscillation elements (XTAL1 and XTAL2). The buffer circuit can be configured with inverter circuits at one end or a plurality of stages (odd stages). The buffer circuit may also be a circuit that can perform oscillation enabled or disabled control or control of a flowing current. Each of the oscillation circuits 101 and 102 can include a feedback resistor installed between one end and the other end of the oscillation element, a first capacitor or a first variable capacitance circuit connected to the one end of the oscillation element, or a second capacitor or a second variable capacitance circuit connected to the other end of the oscillation element. By including the variable capacitance circuit, it is possible to minutely adjust the oscillation frequency. The capacitor or the variable capacitance circuit may be installed only at one of the one end and the other end of the oscillation element, if desired.

The oscillation elements XTAL1 and XTAL2 are, for example, piezoelectric resonators. Specifically, the oscillation elements XTAL1 and XTAL2 are, for example, quartz crystal resonators. For example, the oscillation elements XTAL1 and XTAL2 are thickness sliding oscillation type quartz crystal resonators, such as an AT cut type or an SC cut type. For example, the oscillation elements XTAL1 and XTAL2 may be simple package type (SPXO) resonators, may be an oven type (OCXO) resonator including a thermostatic oven, or may be a temperature compensated type (TCXO) not including a thermostatic oven. As the oscillation elements XTAL1 and XTAL2, surface acoustic wave (SAW) vibrators or micro electro mechanical systems (MEMS) resonators which are resonators made of silicon may be adopted.

In this way, in FIG. 1, the clock signal CK1 is a clock signal generated using the oscillation element XTAL1 and the clock signal CK2 is a clock signal generated using the oscillation element XTAL2. By using the clock signal generated by the oscillation element, an improvement in the precision of the time-to-digital conversion is achieved compared to a scheme in which no oscillation element is employed. However, the embodiment is not limited thereto. Rather, the clock signals CK1 and CK2 may be different in at least clock frequency or may be clock signals generated by, for example, a clock signal generation circuit such as a ring oscillator circuit. Clock signals from oscillators in which the oscillation circuit and the oscillation element are accommodated in a package may also be used.

Figure 2:
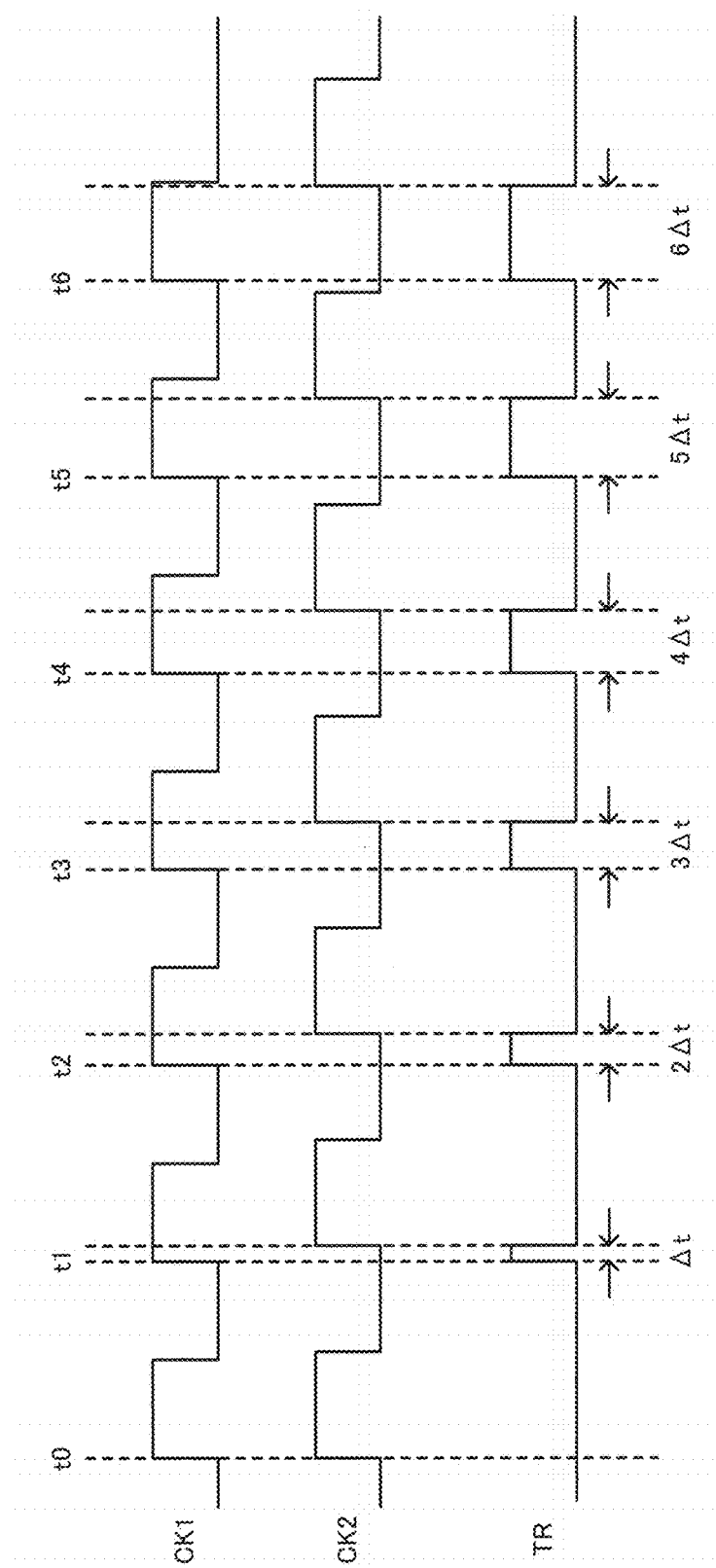
FIG. 2 is a diagram illustrating a time-to-digital conversion scheme using a clock frequency difference.

FIG. 2 is a diagram illustrating a time-to-digital conversion scheme using a clock frequency difference. At t0, the transition timings (phases) of the clock signals CK1 and CK2 match each other. Thereafter, at t1, t2, t3, and the like, an inter-clock time difference TR (phase difference) which is a time difference between the transition timings of the clock signals CK1 and CK2 is lengthened like $\Delta t$, $2\Delta t$, and $3\Delta t$. In FIG. 2, the inter-clock time difference is indicated by a pulse signal of TR.

Here, when f1 and f2 are the clock frequencies of the clock signals CK1 and CK2, a resolution (a time resolution) of the time-to-digital conversion can be expressed as $\Delta t = |1/f1 - 1/f2| = |f1-f2|/(f1 \times f2)$. In the time-to-digital conversion scheme according to the embodiment, a time is converted into a digital value, for example, using the clock frequency difference employing a plurality of oscillation elements. For example, in FIG. 2, a time is converted into a digital value using a frequency difference $\Delta f=|f1-f2|$ between the clock signals CK1 and CK2. In other words, a time is converted into a digital value with the resolution $\Delta t$ corresponding to the frequency difference $\Delta f=|f1-f2|$ between the clock signals CK1 and CK2. For example, a time is converted into a digital value using the principle of a caliper. The resolution $\Delta t$ maybe at least $|f1-f2|/(f1 \times f2)$ and an actual resolution may be less than $|f1-f2|/(f1 \times f2)$.

Figure 3:
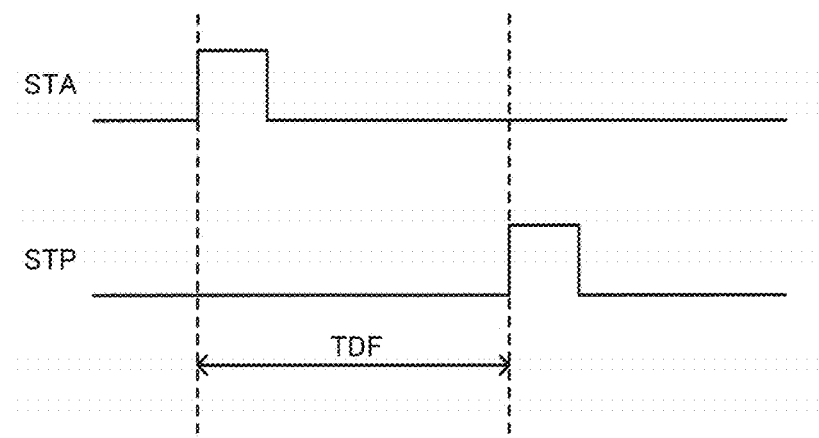
FIG. 3 is a diagram illustrating a relation between signals STA and STP.

FIG. 3 is a diagram illustrating a relation between the signal STA (a first signal such as a start signal) and the signal STP (a second signal such as a stop signal). The time-to-digital conversion circuit 20 according to the embodiment converts a time difference TDF between transition timings of the signals STA and STP into a digital value. In FIG. 3, TDF is a time difference between transition timings of rises (between rising edges) of the signals STA and STP, but may be a time difference between transition timings of falls (between falling edges) of the signals STA and STP.

Figure 4:
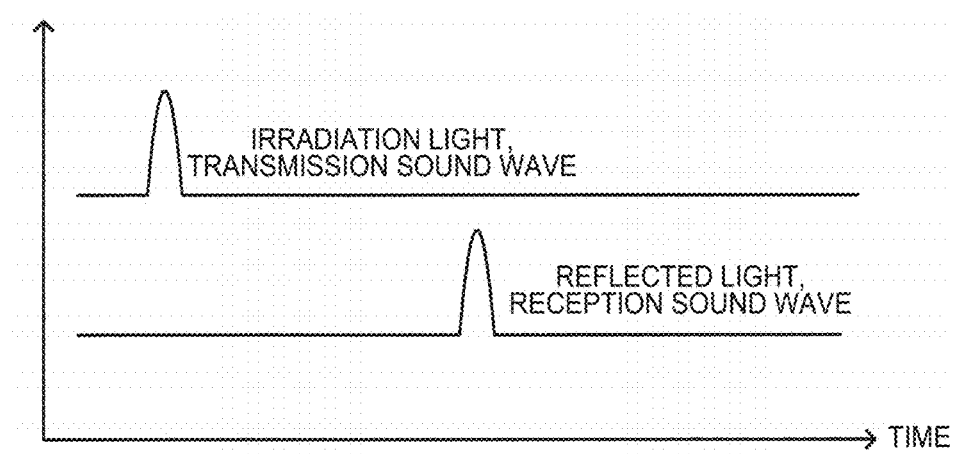
FIG. 4 is a diagram illustrating an example of a physical quantity measurement in which the signals STA and STP are used.

FIG. 4 is a diagram illustrating an example of a physical quantity measurement in which the signals STA and STP are used. For example, a physical quantity measurement apparatus including the circuit device 10 according to the embodiment emits irradiation light (for example, a laser beam) to a target object (for example, an object around a vehicle) using the signal STA. Then, the signal STP is generated by receiving reflected light from the target object. For example, the physical quantity measurement apparatus generates the signal STP by shaping a waveform of a light-received signal. In this way, a distance to the target object can be measured as a physical quantity, for example, in a time of flight (TOF) scheme, by converting the time difference TDF between the transition timings of the signals STA and STP into a digital value. Thus, for example, automatic driving of a vehicle or the like can be implemented.

Alternatively, the physical quantity measurement apparatus transmits a transmission sound wave (for example, an ultrasonic wave) to a target object (for example, an organism) using the signal STA. Then, the signal STP is generated by receiving a reception sound wave from the target object. For example, the physical quantity measurement apparatus generates the signal STP by shaping a waveform of the reception sound wave. In this way, a distance to the target object or the like can be measured by converting the time difference TDF between the transition timings of the signals STA and STP into a digital value. Thus, organism information can be measured with an ultrasonic wave.

In FIGS. 3 and 4, transmission data may be transmitted with the signal STA and a time in which reception data is received after the transmission of the transmission data may be measured using the signal STP in reception of the reception data. A physical quantity measured by the physical quantity measurement apparatus according to the embodiment is not limited to a time or a distance. Various physical quantities such as a flow quantity, a flow rate, a frequency, a speed, an acceleration, an angular velocity, and an angular acceleration can be measured instead.

2. Time-to-Digital Conversion Circuit

Figure 5:
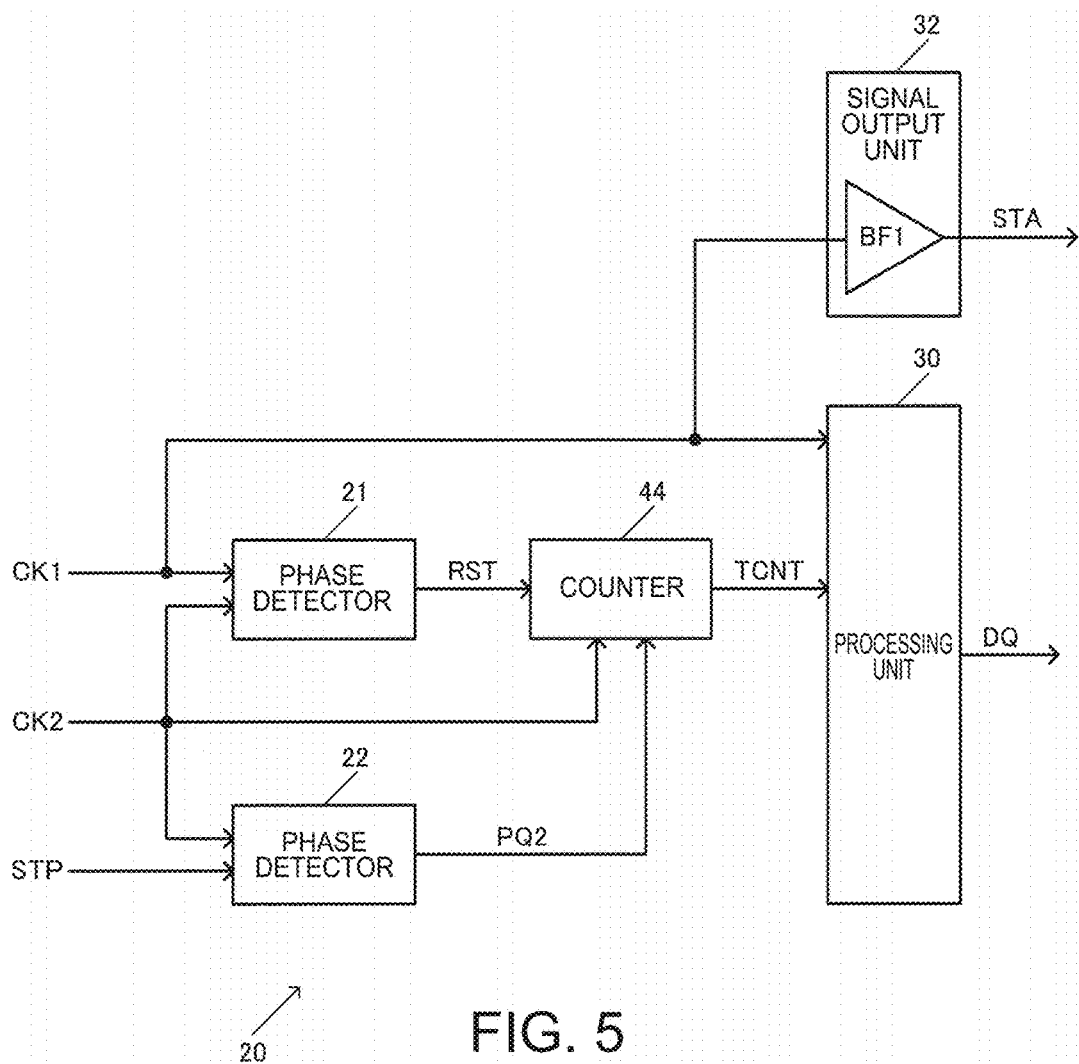
FIG. 5 is a diagram illustrating a first configuration example of a time-to-digital conversion circuit.

FIG. 5 illustrates a first configuration example of the time-to-digital conversion circuit 20. The time-to-digital conversion circuit 20 includes phase detectors 21 and 22, a counter 44, a processing unit 30, and a signal output unit 32. The time-to-digital conversion circuit 20 is not limited to the configuration of FIG. 5, but various modifications can be realized in such a manner that some of the constituent elements may be omitted or other constituent elements may be added.

The clock signals CK1 and CK2 are input to the phase detector 21 (phase comparator) and the phase detector 21 outputs a reset signal RST to the counter 44. For example, the reset signal RST of the pulse signal activated at a phase synchronization timing is output.

The signal STP and the clock signal CK2 are input to the phase detector 22 (a phase comparator) and the phase detector 22 outputs a phase comparison signal PQ2 which is a result of the phase comparison. The phase detector 22 compares the phases of the signal STP and the clock signal CK2, for example, by sampling one of the signal STP and the clock signal CK2 with the other signal.

In the counter 44, a count value TCNT is set based on the reset signal RST from the phase detector 22. Then, the counter 44 performs a process of counting the count value TCNT based on the signal PQ2 of the result of the phase comparison from the phase detector 22. For example, the counter 44 performs the counting process based on the clock signal CK2. Specifically, in the counter 44, the count value TCNT is not updated when the signal PQ2 of the result of the phase comparison of the signal STP and the clock signal CK2 is at a first voltage level (for example, an L level). On the other hand, the count value TCNT is updated when the signal PQ2 of the result of the phase comparison is at a second voltage level (for example, an H level). Then, the time-to-digital conversion circuit 20 calculates the digital value DQ corresponding to the time difference based on the count value TCNT of the counter 44.

In this way, the digital value DQ can be calculated through simple circuit processing in which the process of counting the count value TCNT is performed by the counter 44. Thus, compared to the above-described scheme of the related art in which circuit processing is complicated, the circuit processing is simpler.

The processing unit 30 performs an arithmetic process of calculating the digital value DQ corresponding to the time difference between the signals STA and STP. Specifically, the processing unit 30 performs an arithmetic process of calculating the digital value DQ based on the count value TCNT. The processing unit 30 can be realized by, for example, an ASIC logic circuit or a processor such as a CPU.

The signal output unit 32 outputs the signal STA based on the clock signal CK1. For example, the signal output unit 32 outputs the signal STA at each clock cycle of the clock signal CK1 based on the clock signal CK1. In FIG. 5, the signal output unit 32 is configured with a buffer circuit BF1 and outputs a signal obtained by buffering the clock signal CK1 as the signal STA. In this way, the signal output unit 32 can spontaneously generate the signal STA of which a signal level is transitioned at each clock cycle of the clock signal CK1 and outputs the signal STA.

Figure 6:
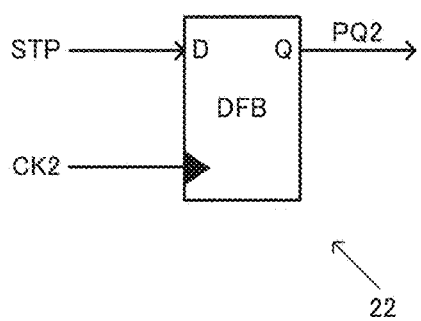
FIG. 6 is a diagram illustrating a configuration example of a phase detector.

FIG. 6 is a diagram illustrating a configuration example of the phase detector 22. The phase detector 22 is configured by, for example, a flip-flop circuit DFB. The signal STP is input to a data terminal of the flip-flop circuit DFB and the clock signal CK2 is input to a clock terminal of the flip-flop circuit DFB. Thus, it is possible to realize phase comparison by sampling the signal STP with the clock signal CK2. The clock signal CK2 may also be input to the data terminal of the flip-flop circuit DFB and the signal STP may also be input to the clock terminal of the flip-flop circuit DFB. Thus, it is possible to realize the phase comparison by sampling the clock signal CK2 with the signal STP.

Figure 7:
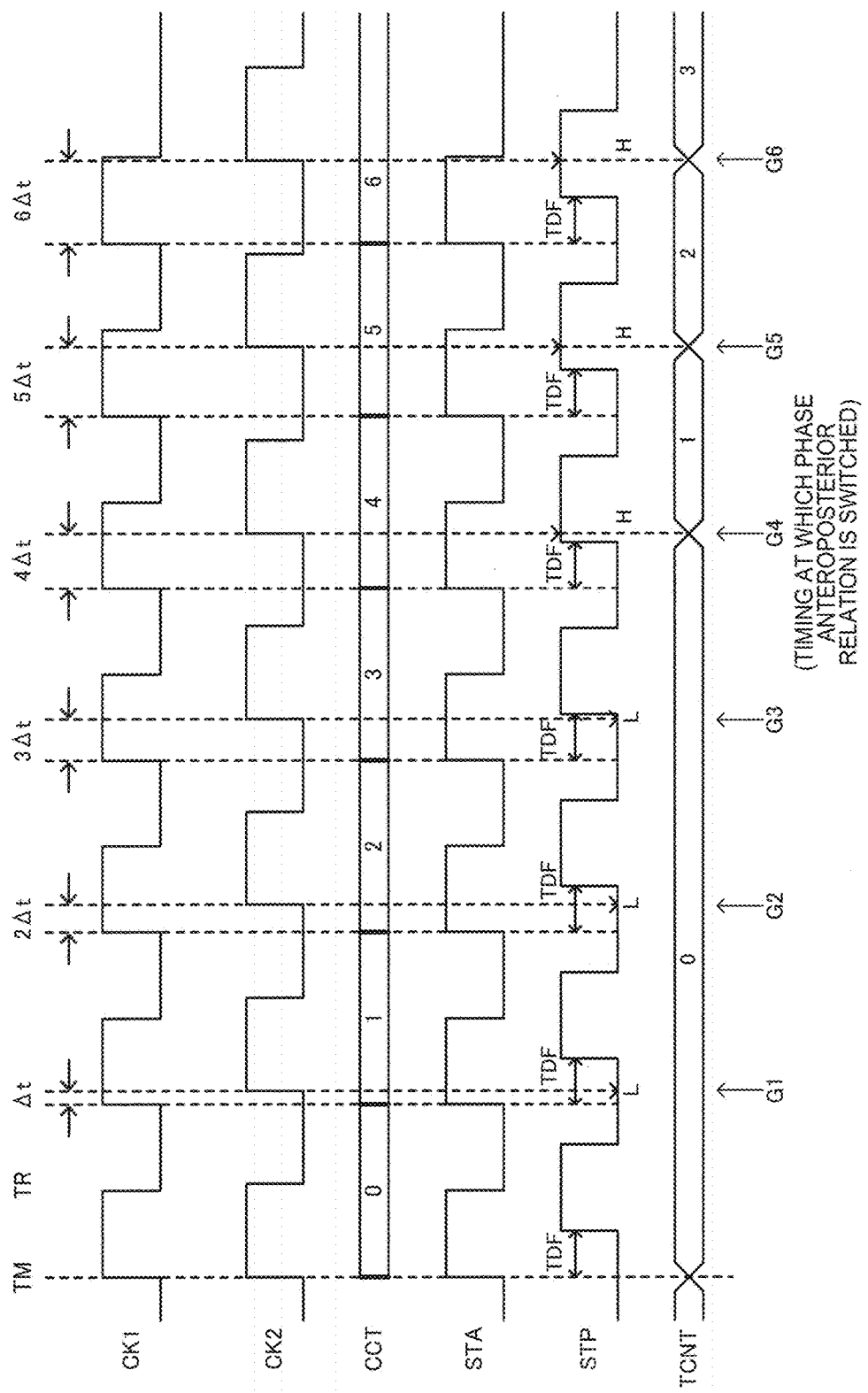
FIG. 7 is a diagram illustrating signal waveforms for describing an operation of the time-to-digital conversion circuit in the first configuration example.

FIG. 7 is a diagram illustrating signal waveforms for describing an operation of the time-to-digital conversion circuit 20 having the first configuration example of FIG. 5. In FIG. 7, the phases of the clock signals CK1 and CK2 are synchronized at a phase synchronization timing TM. Specifically, at the phase synchronization timing TM, the phase synchronization in which the phase of the transition timings (for example, rising transition timings or rising edges) of the clock signals CK1 and CK2 match is performed. The phase synchronization is performed by the synchronization circuit 110 in FIG. 1. At the phase synchronization timing TM, the count value TCNT of the counter 44 is reset to, for example, 0.

When the phase synchronization timing TM is a known timing in the system of the circuit device 10, the phase synchronization timing TM is set by, for example, a timing control unit (not illustrated). In this case, the function of the phase detector 21 in FIG. 5 is realized by the timing control unit. That is, the timing control unit outputs the reset signal RST activated at the phase synchronization timing TM to the counter 44.

The time-to-digital conversion circuit 20 transitions the signal level of the signal STA based on the clock signal CK1 after the phase synchronization timing TM of the clock signals CK1 and CK2. Specifically, the signal level of the signal STA is transitioned at each clock cycle of the clock signal CK1 after the phase synchronization timing TM. For example, the signal level of the signal STA is transitioned from the L level to the H level. For example, the signal output unit 32 in FIG. 5 transitions the signal level of the signal STA at each clock cycle of the clock signal CK1 by outputting the signal obtained by buffering the clock signal CK1 in the buffer circuit BF1 as the signal STA.

In FIG. 7, CCT is a clock cycle value. The clock cycle value CCT is updated at each clock cycle of the clock signal CK1. Specifically, the clock cycle value CCT increases at each clock cycle. Here, to facilitate the description, the clock cycle value of the initial clock cycle is set to CCT=0. Therefore, the clock cycle value of the subsequent clock cycle is CCT=1. In FIG. 7, CCT is the clock cycle value of the clock signal CK1, but a clock cycle value of the clock signal CK2 may be used.

In this way, when the signal level of the signal STA is transitioned based on the clock signal CK1 after the phase synchronization timing TM, as described with reference to FIGS. 2 and 3, the signal level of the signal STP is transitioned to correspond to the signal STA. Here, a time difference between the transition timings of the signals STA and STP is TDF.

In this case, the time-to-digital conversion circuit 20 compares the phases of the signal STP and the clock signal CK2, as indicated by G1 to G6 of FIG. 7. Then, the digital value DQ corresponding to the time difference TDF between the transition timings of the signals STA and STP is calculated based on a result of the phase comparison. Specifically, the processing unit 30 in FIG. 5 performs an arithmetic process of calculating the digital value DQ based on the signal PQ2 of the result of the phase comparison from the phase detector 22.

For example, as described with reference to FIG. 2, after the phase synchronization timing TM, the inter-clock time difference TR which is the time difference between the transition timings of the clock signals CK1 and CK2 increases at each clock cycle of the clock signal CK1, for example, like Δt, 2Δt, 3Δt, . . . , and 6Δt. In the repeating scheme according to the embodiment, the time-to-digital conversion is realized focusing on the inter-clock time difference TR increasing by Δt in this way after the phase synchronization timing TM.

Specifically, the time-to-digital conversion circuit 20 compares the phases of the signal STP and the clock signal CK2 at each clock cycle, as indicated by G1 to G6 of FIG. 7. The phase comparison can be realized, for example, by sampling one of the signal STP and the clock signal CK2 with the other signal. For example, as described in FIG. 6, the phase comparison is realized by causing the phase detector 22 to sample the signal STP with the clock signal CK2. The phase comparison may also be realized by sampling the clock signal CK2 with the signal STP.

For example, in G1 to G3 of FIG. 7, the signal PQ2 of the results of the phase comparison which is a signal obtained by sampling the signal STP with the clock signal CK2 is at an L level. That is, in G1 to G3, since the phase of the signal STP is later than the phase of the clock signal CK2, the signal PQ2 is at the L level. When the phase comparison is performed sampling the clock signal CK2 with the signal STP, the signal PQ2 is at the H level in G1 to G3.

In this way, in G1 to G3 of FIG. 7, the phase of the signal STP is determined to be behind the phase of the clock signal CK2 in accordance with the results of the phase comparison of the signal STP and the clock signal CK2. In other words, in G1, G2, and G3, TDF>TR=Δt, TDF>TR=2Δt, and TDF>TR=3Δt are satisfied, respectively, and the time difference TDF between the transition timings of the signals STA and STP is longer than the inter-clock time difference TR between the clock signals CK1 and CK2.

Then, in G4 of FIG. 7, the phase anteroposterior relation between the signal STP and the clock signal CK2 is switched. For example, a state in which the phase of the signal STP is behind the phase of the clock signal CK2 is switched to a state in which the phase of the signal STP is in front of the phase of the clock signal CK2.

When the phase anteroposterior relation is switched in this way, as indicated by G4 to G6, the signal PQ2 of the results of the phase comparison which is the signal obtained by sampling the signal STP with the clock signal CK2 enters an H level. That is, in G4 to G6, since the phase of the signal STP is in front of the phase of the clock signal CK2, the signal PQ2 enters the H level. When the phase comparison is performed sampling the clock signal CK2 with the signal STP, the signal PQ2 is at the L level in G4 to G6.

In this way, in G4 to G6, the phase of the signal STP is determined to be in front of the phase of the clock signal CK2 in accordance with the result of the phase comparison of the signal STP and the clock signal CK2. In other words, in G4, G5, and G6, TDF<TR=4Δt, TDF<TR=5Δt, and TDF<TR=6Δt are satisfied and the time difference TDF between the transition timings of the signals STA and STP is shorter than the inter-clock time difference TR between the clock signals CK1 and CK2.

In G1 to G3 of FIG. 7, the signal PQ2 of the results of the phase comparison is at the L level and the phase of the signal STP is determined to be behind the phase of the clock signal CK2. In this case, the count value TCNT of the counter 44 in FIG. 5 is not updated. For example, the count value TCNT does not increase from 0. Conversely, in G4 to G6, the signal PQ2 of the results of the phase comparison is at the H level and the phase of the signal STP is determined to be in front of the phase of the clock signal CK2. In this case, the count value TCNT of the counter 44 is updated. For example, the count value TCNT increases by, for example, 1 at each clock cycle.

The time-to-digital conversion circuit 20 (the processing unit 30) calculates the digital value DQ corresponding to the time difference TDF using the count value TCNT obtained in this way. For example, by performing a process of converting a code indicated by the count value TCNT, an output code which is the final digital value DQ is calculated and output.

In FIG. 7, when the phase of the signal STP is behind the phase of the clock signal CK2, the count value TCNT is not updated. When the phase of the signal STP is in front of the phase of the clock signal CK2, the count value TCNT is updated and vice versa. For example, when the phase of the signal STP is behind the clock signal CK2 (G1 to G3), the count value TCNT may be updated. When the phase of the signal STP is in front of the clock signal CK2 (G4 to G6), the count value TCNT may not be updated. That is, at least, when the signal PQ2 of the result of the phase comparison is at the first voltage level, the count value TCNT may not be updated. When the signal PQ2 is at the second voltage level, the count value TCNT may be updated. In this case, the first voltage level at which the count value TCNT is not updated is, for example, the H level (G4 to G6) and the second voltage level (G1 to G3) at which the count value TCNT is updated is, for example, the L level.

Figure 8:
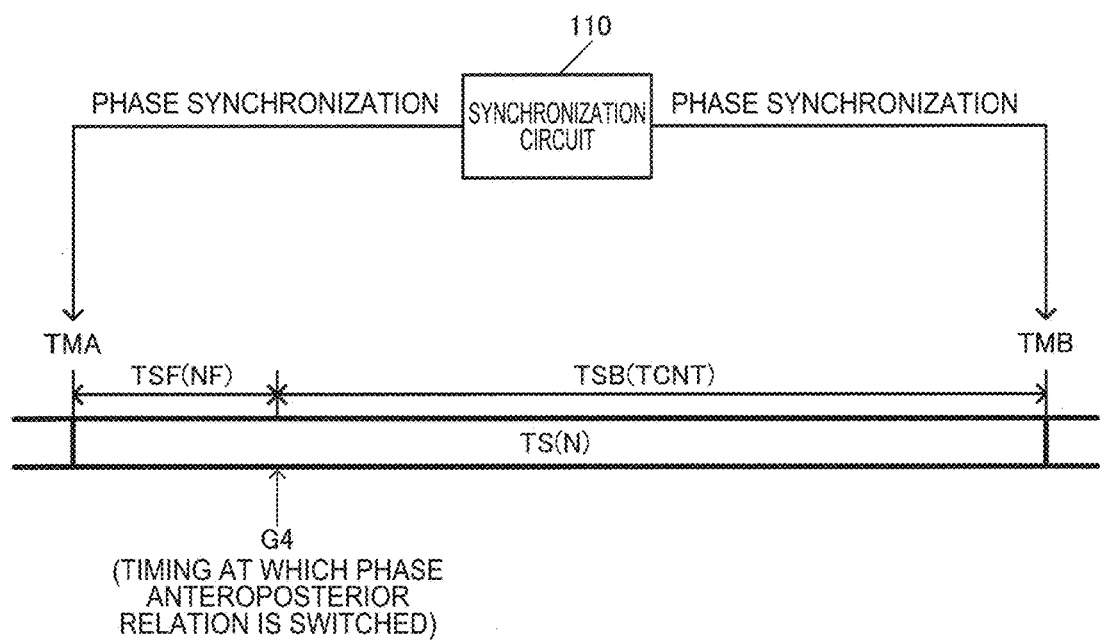
FIG. 8 is a diagram illustrating a time-to-digital conversion scheme according to the embodiment.

FIG. 8 is a diagram illustrating a time-to-digital conversion scheme according to the embodiment. At the phase synchronization timings TMA and TMB, the phases of the clock signals CK1 and CK2 are synchronized by the synchronization circuit 110. Thus, the transition timings of the clock signals CK1 and CK2 match at the phase synchronization timings TMA and TMB. Then, a space between the phase synchronization timings TMA and TMB is a measurement period TS. In the repeating scheme according to the embodiment, the digital value DQ corresponding to the time difference TDF is calculated during the measurement period TS.

Specifically, as described with reference to FIG. 7, after the phase synchronization timing TMA (TM), the signal level of the signal STA is transitioned based on the clock signal CK1 and the signal level of the signal STP is transitioned to correspond to the signal STA. In this case, as indicated by G4 of FIGS. 7 and 8, the time-to-digital conversion circuit 20 calculates the digital value DQ corresponding to the time difference TDF by specifying at timing at which the phase anteroposterior relation between the signal STP and the clock signal CK2 is switched. Specifically, the digital value DQ is calculated by specifying the clock cycle at which the phase anteroposterior relation is switched.

For example, as indicated by G1 to G3 of FIG. 7, the phase of the signal STP is behind the phase of the clock signal CK2 at the clock cycles at which CCT=1, 2, and 3 are set, and thus TDF>TR is satisfied. Conversely, as indicated by G4, the phase anteroposterior relation between the signal STP and the clock signal CK2 is switched at the clock cycle of CCT=4. That is, as indicated by G4 to G6, the phase of the signal STP is in front of the phase of the clock signal CK2 at the clock cycles at which CCT=4, 5, and 6 are set, and thus TDF<TR is satisfied.

In this way, in the embodiment, the digital value DQ is calculated by comparing the phases of the signal STP and the clock signal CK2 and specifying (determining) a timing at which the phase anteroposterior relation between these signals is switched. For example, by specifying a clock cycle at which CCT=4 indicated by G4 is set, the digital value DQ corresponding to the time difference TDF can be determined to be a digital value corresponding to, for example, TR=4Δt (or a digital value corresponding to a value between 3Δt and 4Δt). Accordingly, since the time difference TDF can be converted into the digital value DQ during the one-time measurement period TS in FIG. 8, acceleration of the time-to-digital conversion is achieved.

For example, in the scheme of the related art of the above-described JP-A-5-87954, only one start pulse is generated during the one-time measurement period in which time measurement is performed. To calculate the final digital value, it is necessary to repeat the measurement period a large number of times.

In contrast, according to the repeating scheme according to the embodiment, as illustrated in FIGS. 7 and 8, the digital value DQ is calculated by generating the signal STA a plurality of times during the one-time measurement period TS and performing the phase comparison a plurality of times (for example, 1000 times or more). Thus, since the final digital value DQ can be calculated within the one-time measurement period TS, the time-to-digital conversion can be considerably accelerated compared to the scheme of the related art.

In FIG. 8, the length of the measurement period TS is equivalent to, for example, the number of clocks N (the number of clock cycles) of the clock signal CK1 during the measurement period TS. For example, the synchronization circuit 110 synchronizes the phases of the clock signals CK1 and CK2 during each measurement period TS corresponding to the set number of clocks N. According to the embodiment, to realize the time-to-digital conversion of a high resolution, the number of clocks N during the measurement period TS is set to, for example, a very large number such as 1000 or more (or 5000 or more). For example, when f1 and f2 are clock frequencies of the clock signals CK1 and CK2, the resolution of the time-to-digital conversion according to the embodiment can be expressed as $\Delta t=|f1-f2|/(f1 \times f2)$. Accordingly, as the frequency difference $|f1-f2|$ is smaller or $f1 \times f2$ is larger, the resolution $\Delta t$ is smaller. Thus, it is possible to realize time-to-digital conversion with high resolution. When the resolution $\Delta t$ is smaller, the number of clocks N during the measurement period TS also increases.

The count value TCNT of the counter 44 described with reference to FIGS. 5 and 7 is equivalent to the length of the period TSB in FIG. 8. Here, TSF is set as a period of the first half from the phase synchronization timing TMA to the timing of G4 at which the phase anteroposterior relation is switched and TSB is set as a period of the second half from the timing of G4 to the phase synchronization timing TMB. For example, when NF is the number of clocks (the number of clock cycles) of the clock signal CK1 during the period TSF, for example, N=NF+TCNT is established. For example, since NF=4 is satisfied in FIG. 7, a value corresponding to the final digital value DQ=4×Δt is a digital value corresponding to the number of clocks NF. Therefore, the time-to-digital conversion circuit 20 (the processing unit 30) calculates the digital value corresponding to NF=N−TCNT based on the count value TCNT. For example, when the digital value DQ is 8 bits, the digital value corresponding to the number of clocks N is, for example, 11111111. However, the process of counting the number of clocks NF of the counter 44 may be performed and the digital value DQ may be calculated.

When the number of clocks N corresponding to the measurement period TS is set to be large, the time difference TDF which can be measured in FIG. 7 is shorter. Thus, a dynamic range may decrease. In the repeating scheme according to the embodiment, the time-to-digital conversion is completed during the one-time measurement period TS while increasing the number of clocks N and raising the resolution. Thus, for example, it is possible to realize a high resolution, for example, while realizing acceleration of the conversion process such as a flash type A/D conversion.

In this case, in the repeating scheme according to the embodiment, the signal STA may not usually be generated at each clock cycle to perform the phase comparison, but the signal STA may be generated only during a specific period and the phase comparison may be performed. For example, according to a binary searching scheme to be described below, after a searching range of the digital value DQ is narrowed, the signal STA may be generated at each clock cycle during a period corresponding to the searching range to perform the phase comparison and the final digital value DQ may be calculated. In this case, only during the period corresponding to the narrowed searching range, for example, during the measurement period TS of FIG. 8, the time-to-digital conversion in which the signal STA is generated at each clock cycle and the phase comparison is performed may be performed. For example, it is assumed that the digital value DQ is 10 bits and the measurement period TS is a period corresponding to $\Delta t$ to 1024$\Delta t$. In this case, for example, when the searching range is narrowed to $\Delta t$ to 256$\Delta t$, digital conversion in which the signal STA is generated at each clock cycle and the phase comparison is performed may be performed only during the first half period corresponding to $\Delta t$ to 256$\Delta t$.

After the timing (G4) at which the phase anteroposterior relation is switched in FIGS. 7 and 8 is specified, the signal STA may not be generated, so that power saving is achieved.

In this way, in the scheme according to the embodiment, various modifications can be realized in such a manner that it is usually not necessary to generate the signal STA at each clock cycle and perform the phase comparison, and the signal STA based on the clock signal CK1 is generated only during a certain specific period.

In the embodiment, as described with reference to FIG. 2, the time-to-digital conversion circuit 20 performs the time-to-digital conversion with the resolution $\Delta t$ corresponding to the frequency difference $\Delta f = |f1-f2|$ between the clock frequencies f1 and f2 of the clock signals CK1 and CK2. For example, the time-to-digital conversion is performed with the resolution $\Delta t = |f1-f2|/(f1 \times f2)$.

In this way, by decreasing the frequency difference $\Delta f = |f1-f2|$ between the clock frequencies f1 and f2, it is possible to decrease the resolution $\Delta t = |f1-f2|/(f1 \times f2)$. Thus, it is possible to realize the time-to-digital conversion with a high resolution.

More specifically, the time-to-digital conversion circuit 20 performs the time-to-digital conversion with the resolution $\Delta t$ after the phase synchronization timing when the time difference between the transition timings of the clock signals CK1 and CK2 at an i-th clock cycle is TR=i×$\Delta t$ (where i is an integer equal to or greater than 1).

Figure 9:
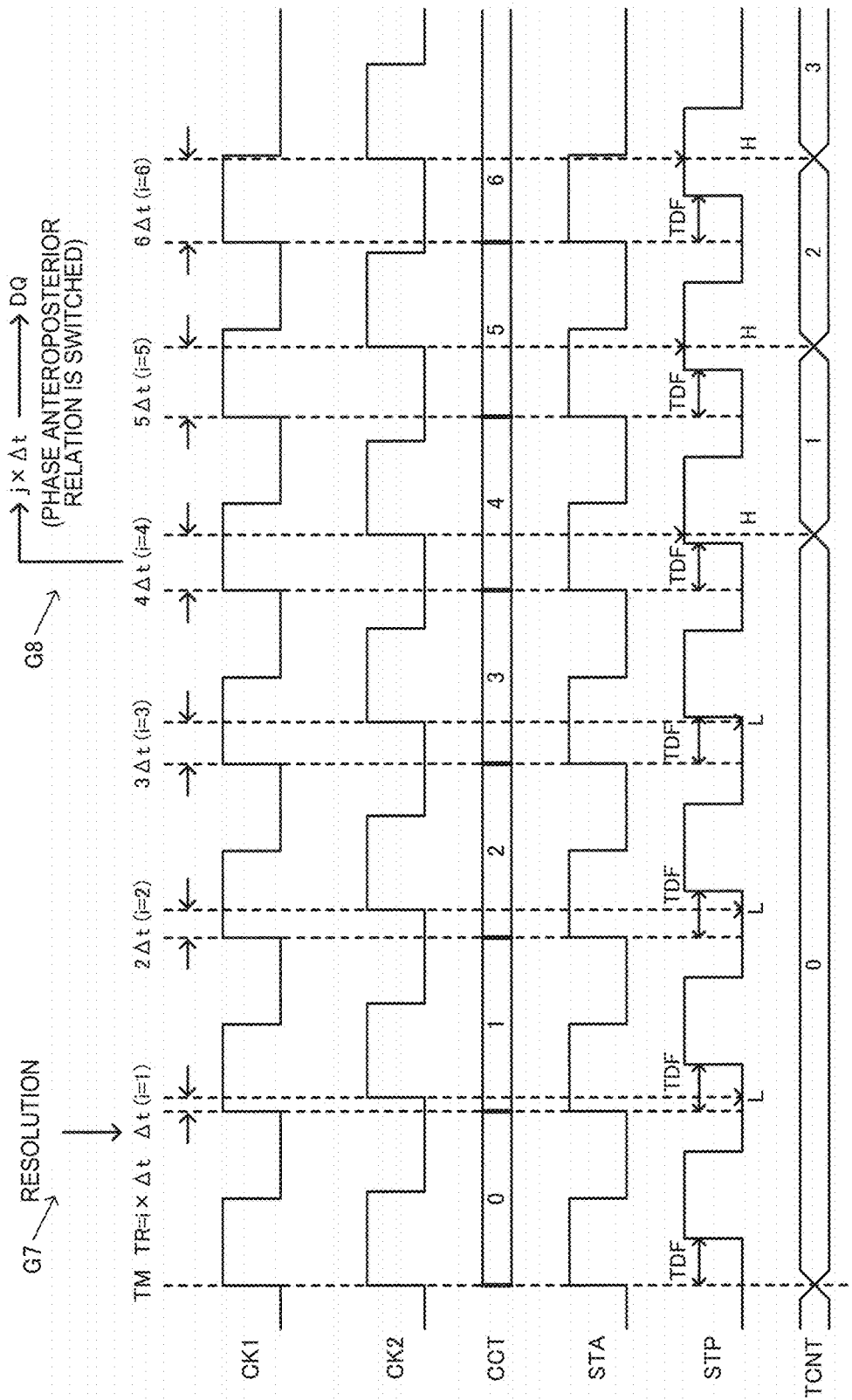
FIG. 9 is a diagram illustrating the time-to-digital conversion scheme according to the embodiment.

For example, as illustrated in FIG. 9, the inter-clock time difference TR=i×$\Delta t$ between the clock signals CK1 and CK2 after the phase synchronization timing TM of the clock signals CK1 and CK2 increases like $\Delta t$, 2$\Delta t$, 3$\Delta t$, . . . , 6$\Delta t$. For example, TR=$\Delta t$ is set at a first clock cycle (where i=1 and CCT=1) of the clock signal CK1 and TR=2$\Delta t$ is set at a second clock cycle (where i=2 and CCT=2). Similarly, TR=3$\Delta t$ to 6$\Delta t$ is set at third to sixth clock cycles (where i=3 to 6 and CCT=3 to 6).

In the embodiment, when the time difference between the transition timings of the clock signals CK1 and CK2 at the i-th clock cycle after the phase synchronization timing TM is set to TR=i×$\Delta t$, the time-to-digital conversion is performed with the resolution $\Delta t$ as indicated by G7. That is, the time-to-digital conversion with the resolution $\Delta t$ is realized by determining a magnitude relation between the inter-clock time difference TR and the time difference TDF using the fact that the inter-clock time difference TR=i×$\Delta t$ increases sequentially by $\Delta t$ after the phase synchronization timing TM.

In this way, the time difference TDF can be converted into the digital value DQ with the resolution $\Delta t$ corresponding to the frequency difference between the clock frequencies f1 and f2 of the clock signals CK1 and CK2, and time-to-digital conversion with high resolution can be realized.

Specifically, the time-to-digital conversion circuit 20 calculates the digital value corresponding to TR=j×$\Delta t$ as the digital value DQ corresponding to the time difference TDF when the phase anteroposterior relation between the signal STP and the clock signal CK2 is switched at a j-th clock cycle after the phase synchronization timing TM.

For example, in FIG. 9, the phase anteroposterior relation between the signal STP and the clock signal CK2 is switched at the fourth clock cycle (j=4 and CCT=4) after the phase synchronization timing TM. That is, at the third clock cycle (CCT=3), the phase of the signal STP is behind the phase of the clock signal CK2. At the fourth clock cycle (CCT=4), the phase of the signal STP is in front of the phase of the clock signal CK2. In this case, as indicated by G4, a digital value corresponding to 4$\Delta t$ (in a broad sense, TR=j×$\Delta t$) is calculated as the digital value DQ corresponding to the time difference TDF and is output as a final output code.

In this way, the digital value DQ corresponding to the time difference TDF can be calculated through the simple process of determining the timing at which the phase anteroposterior relation between the signal STP and the clock signal CK2 is switched. Accordingly, the time-to-digital conversion can be realized with simple circuit processing compared to the scheme of the related art, and thus simplification or miniaturization of the circuit configuration is achieved.

In the embodiment, as illustrated in FIG. 1, the clock signals CK1 and CK2 are clock signals generated using the oscillation elements XTAL1 and XTAL2. In this way, according to the scheme in which the clock signals CK1 and CK2 generated by the oscillation elements XTAL1 and XTAL2 are used, it is possible to considerably improve the precision of time (physical quantity) measurement compared to the scheme of the related art in which the time-to-digital conversion is realized using semiconductor elements such as vernier delay circuits.

For example, in the scheme of the related art in which the semiconductor elements are used, it is relatively easy to improve a resolution, but there is a problem that it is difficult to improve precision. That is, the delay times of the delay elements, which are the semiconductor elements, are considerably changed due to a manufacturing variation or an environment change. Therefore, there is a limit to the high precision of measurement due to the change. For example, relative precision can be ensured to some extent, but it is difficult to ensure absolute precision.

In contrast, a change in the oscillation frequency of the oscillation element is considerably small due to a manufacturing variation or an environment change compared to the delay times of the delay elements which are the semiconductor elements. Accordingly, according to the scheme of performing the time-to-digital conversion using the clock signals CK1 and CK2 generated by the oscillation elements XTAL1 and XTAL2, it is possible to considerably improve the precision compared to the scheme of the related art in which the semiconductor elements are used. By decreasing a frequency difference between the clock signals CK1 and CK2, it is possible to also improve the resolution.

For example, when a frequency difference between the clock signals CK1 and CK2 is $\Delta f=|f1-f2|=1$ MHz and f1 and f2 are set to about 100 MHz, the resolution $\Delta t=|f1-f2|/(f1 \times f2)$ of the time measurement can be set to about 100 picoseconds (ps). Similarly, when f1 and f2 are set to about 100 MHz and $\Delta f=100$ kHz, 10 kHz, and 1 kHz are set, the resolution can be set to about $\Delta t=10$ ps, 1 ps, and 0.1 ps, respectively. The change in the oscillation frequencies of the oscillation elements XTAL1 and XTAL2 is considerably small compared to the scheme in which the semiconductor elements are used. Accordingly, it is possible to realize compatibility of the improvement in the resolution and the precision.

In the scheme of the related art of the above-described JP-A-5-87954, the time-to-digital conversion is realized using quartz crystal oscillators. In the scheme of the related art, however, the start timings of time measurement are sequentially delayed from a timing of a synchronization point at which the edges of the first and second clock pulses match. Each time measurement is performed from the timing of the synchronization point at which the edges of the first and second clock pulses match, and thus it is necessary to repeat the time measurement several times. Therefore, there is a problem that a conversion time of the time-to-digital conversion is considerably lengthened.

In contrast, according to the embodiment, the time-to-digital conversion is realized by generating the signal STA a plurality of times during the measurement period TS and performing the phase comparison a plurality of times. Accordingly, it is possible to considerably accelerate the time-to-digital conversion compared to the scheme of the related art.

Figure 10:
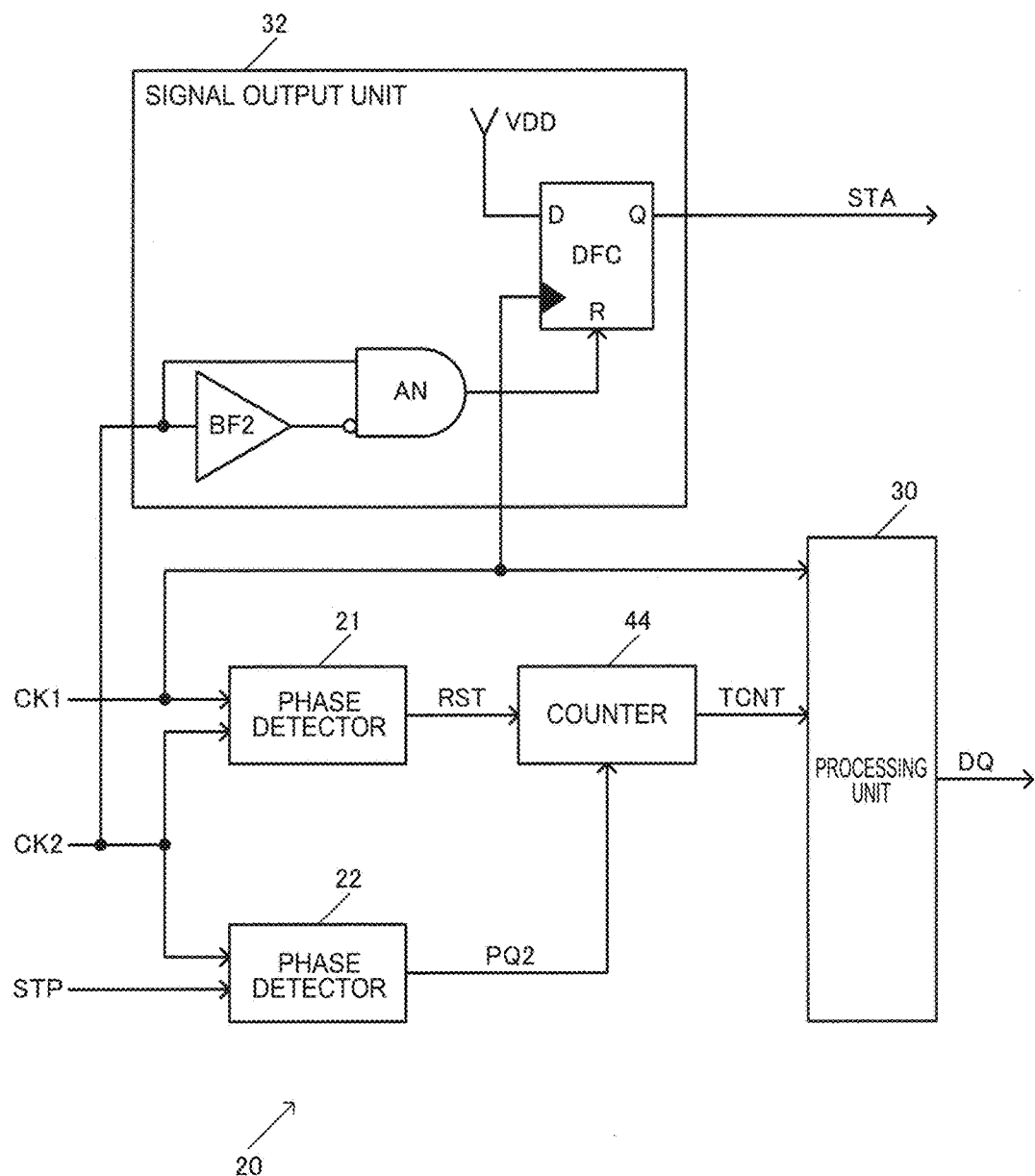
FIG. 10 is a diagram illustrating a second configuration example of a time-to-digital conversion circuit.
Figure 11:
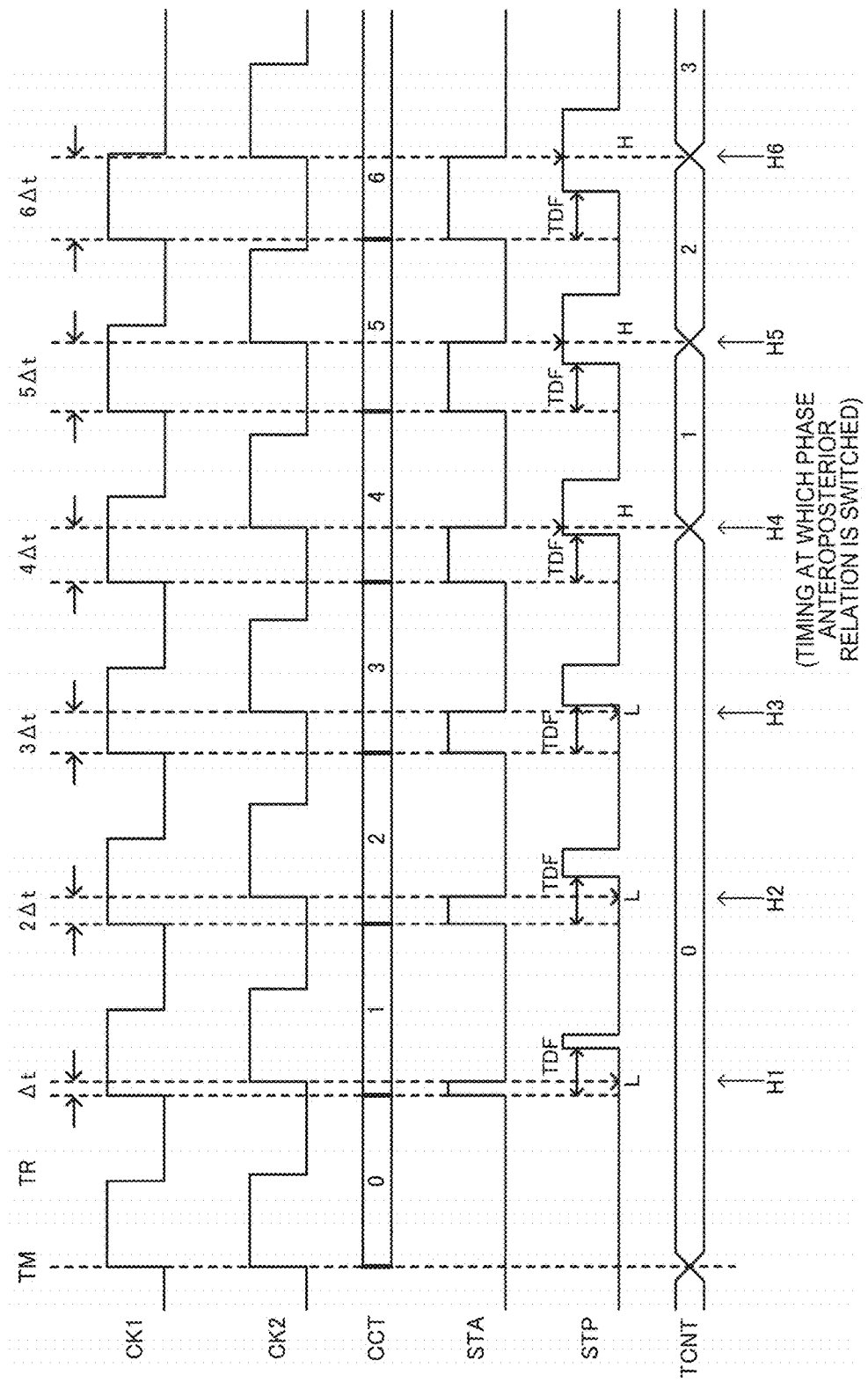
FIG. 11 is a diagram illustrating signal waveforms for describing an operation of the time-to-digital conversion circuit in the second configuration example.

FIG. 10 illustrates a second configuration example of the time-to-digital conversion circuit 20. FIG. 11 is a diagram illustrating signal waveforms for describing an operation of the second configuration example. A difference between the first configuration example of FIG. 5 and a second configuration example of FIG. 10 is a circuit configuration of the signal output unit 32.

In FIG. 10, the signal output unit 32 is configured to include a flip-flop circuit DFC, an AND circuit AN, and a buffer circuit BF2. The AND circuit AN and the buffer circuit BF2 form a pulse signal generation circuit. The clock signal CK2 is input and the pulse signal generation circuit outputs a reset signal of a pulse signal activated (at the H level) at a rising transition timing (rising edge) of the clock signal CK2 to a reset terminal of the flip-flop circuit DFC. A power voltage VDD of a high potential side is input to a data terminal of the flip-flop circuit DFC and the clock signal CK1 is input to a clock terminal.

The signal output unit 32 having such a circuit configuration is used to generate the signal STA which is activated (at the H level) at a rising transition timing of the clock signal CK1 and is not activated (at the L level) at a rising transition timing of the clock signal CK2, as illustrated in FIG. 11. Thus, it is possible to realize the signal output unit 32 that outputs the signal STA at each clock cycle of the clock signal CK1 based on the clock signal CK1. The signal level of the signal STA can be transitioned at each clock cycle of the clock signal CK1 after the phase synchronization timing.

As indicated by H1 to H6 of FIG. 11, the phases of the signal STP and the clock signal CK2 of which the signal level is transitioned to correspond to the signal STA generated in this way are compared. As described above, by specifying the timing (clock cycle) of H4 at which the phase anteroposterior relation between the signal STP and the clock signal CK2 is switched, it is possible to calculate the digital value DQ corresponding to the time difference TDF.

3. Synchronization Circuit

Next, a specific configuration example of the synchronization circuit 110 will be described. The synchronization circuit 110 is not limited to the following configuration, but various modifications can be realized in such a manner that some of the constituent elements may be omitted or other constituent elements may be added.

Figure 12:
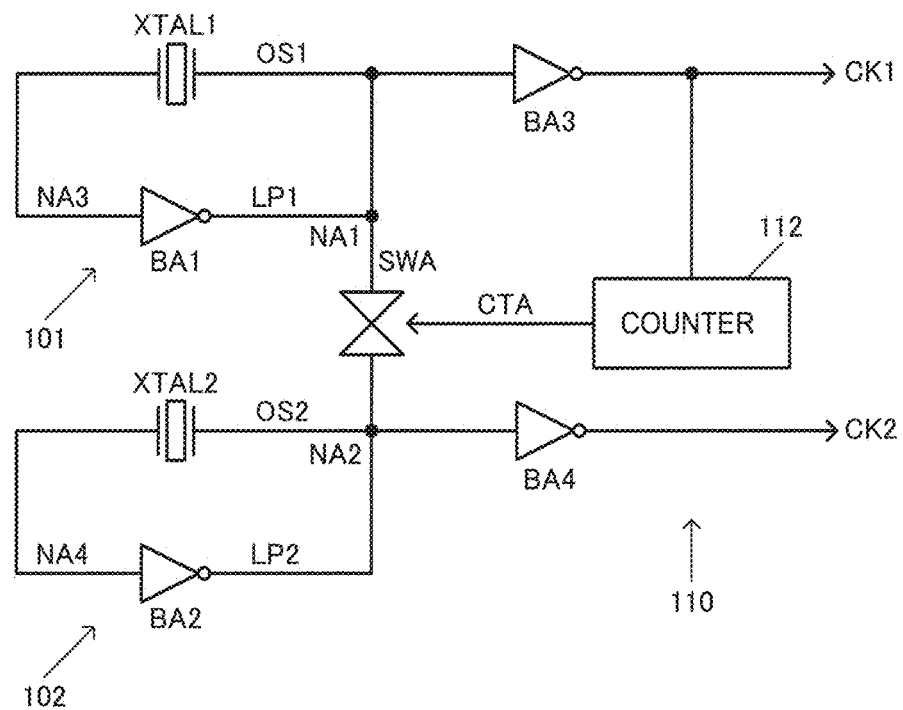
FIG. 12 is a diagram illustrating a first configuration example of a synchronization circuit.
Figure 13:
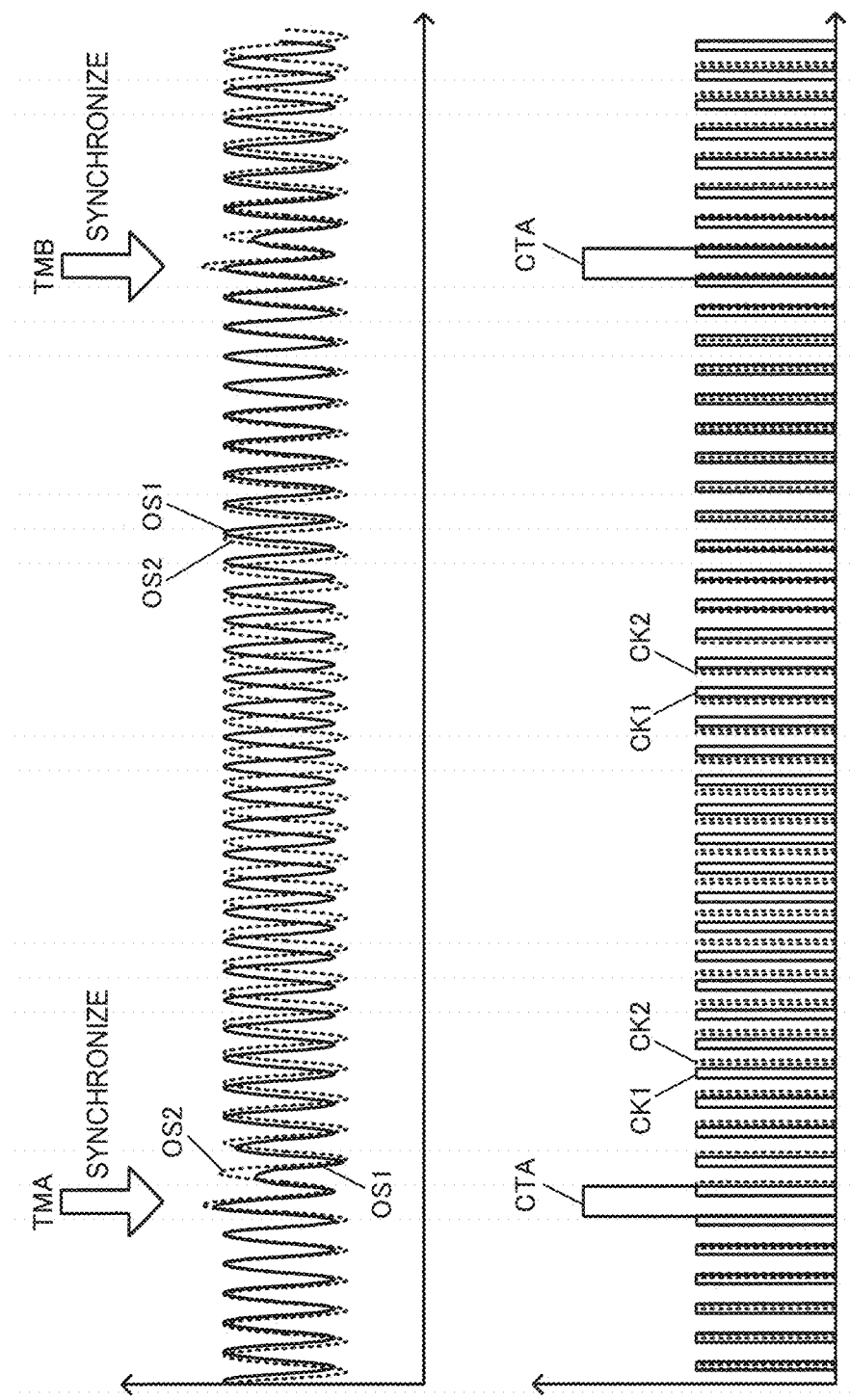
FIG. 13 is a diagram illustrating signal waveforms for describing an operation of the synchronization circuit.

FIG. 12 illustrates a first configuration example of the synchronization circuit 110. FIG. 13 illustrates signal waveforms for describing an operation of the synchronization circuit 110.

The oscillation circuits 101 and 102 generate the clock signals CK1 and CK2 with the clock frequencies f1 and f2 by oscillating the oscillation elements XTAL1 and XTAL2. For example, oscillation signals OS1 and OS2 at the oscillation circuits 101 and 102 are buffered by buffer circuits BA3 and BA4 to be output as the clock signals CK1 and CK2.

The synchronization circuit 110 synchronizes phases of the clock signals CK1 and CK2. For example, the synchronization circuit 110 synchronizes the phases of the clock signals CK1 and CK2 at each phase synchronization timing (each given timing). For example, the synchronization circuit 110 performs phase synchronization to match the transition timings of the clock signals CK1 and CK2 with each other at each phase synchronization timing.

Specifically, the synchronization circuit 110 in FIG. 12 synchronizes the phases of the oscillation signal OS1 (a first oscillation signal) in the oscillation circuit 101 and the oscillation signal OS2 (a second oscillation signal) in the oscillation circuit 102. For example, the synchronization circuit 110 synchronizes the phases of the oscillation signals OS1 and OS2 at each phase synchronization timing. For example, in FIG. 13, the phases of the oscillation signals OS1 and OS2 are synchronized at the phase synchronization timing TMA and the phases of the oscillation signals OS1 and OS2 are also synchronized at the phase synchronization timing TMB subsequent thereto. The same applies to subsequent phase synchronization timings. Through the phase synchronization, the phases of the oscillation signals OS1 and OS2 are uniform at the phase synchronization timings.

More specifically, the synchronization circuit 110 performs phase synchronization to match the transition timing of the clock signal CK1 with the transition timing of the clock signal CK2 at each phase synchronization timing. For example, at the phase synchronization timing TMA in FIG. 13, the phase synchronization is performed by the synchronization circuit 110, thereby matching the transition timings (edges) of the clock signals CK1 and CK2. In addition, at the phase synchronization timing TMB, the phase synchronization is performed by the synchronization circuit 110, thereby matching the transition timings of the clock signals CK1 and CK2.

As illustrated in FIG. 12, the synchronization circuit 110 electrically connects an oscillation loop LP1 (a first oscillation loop) of the oscillation circuit 101 to an oscillation loop LP2 (a second oscillation loop) of the oscillation circuit 102 at each phase synchronization timing. For example, the synchronization circuit 110 connects an output node NA1 of an oscillation buffer circuit BA1 (a first buffer circuit) included in the oscillation circuit 101 to an output node NA2 of an oscillation buffer circuit BA2 (a second buffer circuit) included in the oscillation circuit 102.

Specifically, the synchronization circuit 110 includes a counter 112 that performs a counting operation based on one of the clock signals CK1 and CK2. The counter 112 in FIG. 12 performs the counting operation based on, for example, the clock signal CK1. Then, the synchronization circuit 110 performs the phase synchronization whenever a count value of the counter 112 reaches a given set value. The set value is, for example, a value corresponding to the number of clocks (instances) of the clock signal CK1 (or the clock signal CK2) between the phase synchronization timings TMA and TMB in FIG. 13.

More specifically, the synchronization circuit 110 includes a switch circuit SWA that electrically connects the oscillation loop LP1 of the oscillation circuit 101 to the oscillation loop LP2 of the oscillation circuit 102. The switch circuit SWA is turned on based on a signal CTA from the counter 112 to electrically connect the oscillation loop LP1 to the oscillation loop LP2. For example, as illustrated in FIG. 13, the signal CTA is a pulse signal that becomes active (for example, the H level) at each phase synchronization timing. When the signal CTA is activated, the switch circuit SWA is turned on. Specifically, when the count value reaches the set value, the counter 112 activates the signal CTA to turn the switch circuit SWA on. Thereafter, the count value of the counter 112 is reset.

In FIG. 12, when the switch circuit SWA is turned on, there is a concern of a problem occurring in that oscillation could stop when the phases of the oscillation signals OS1 and OS2 deviates exactly at 180 degrees.

Accordingly, in the synchronization circuit 110, it is preferable that one of the oscillation circuits 101 and 102 is activated and the other oscillation circuit is activated at a phase synchronization timing after the activation of the one oscillation circuit (for example, an initial phase synchronization timing). For example, in FIG. 12, the oscillation circuit 101 is activated and the oscillation circuit 102 is activated at a phase synchronization timing after the activation of the oscillation circuit 101. The activation of the oscillation circuit 101 can be realized by, for example, a circuit (e.g., seed circuit, not illustrated) installed in the oscillation circuit 101. Then, when the switch circuit SWA is turned on at the phase synchronization timing after the activation of the oscillation circuit 101, the oscillation signal OS1 in the oscillation circuit 101 is delivered to the oscillation loop LP2 of the oscillation circuit 102. Then, the delivered oscillation signal OS1 becomes a signal and oscillation of the oscillation circuit 102 is activated. In this way, it is possible to prevent the foregoing problem occurring in that the oscillation stops.

As a modification example of FIG. 12, a configuration may be adopted in which the oscillation signal of one of the oscillation circuits 101 and 102 is delivered at each phase synchronization timing to an oscillation loop of the other oscillation circuit. That is, the oscillation loops LP1 and LP2 may not be connected by the switch circuit SWA (bidirectional connection), but the phase synchronization may be realized by delivering the oscillation signal of one oscillation circuit to the other oscillation circuit.

Figure 14:
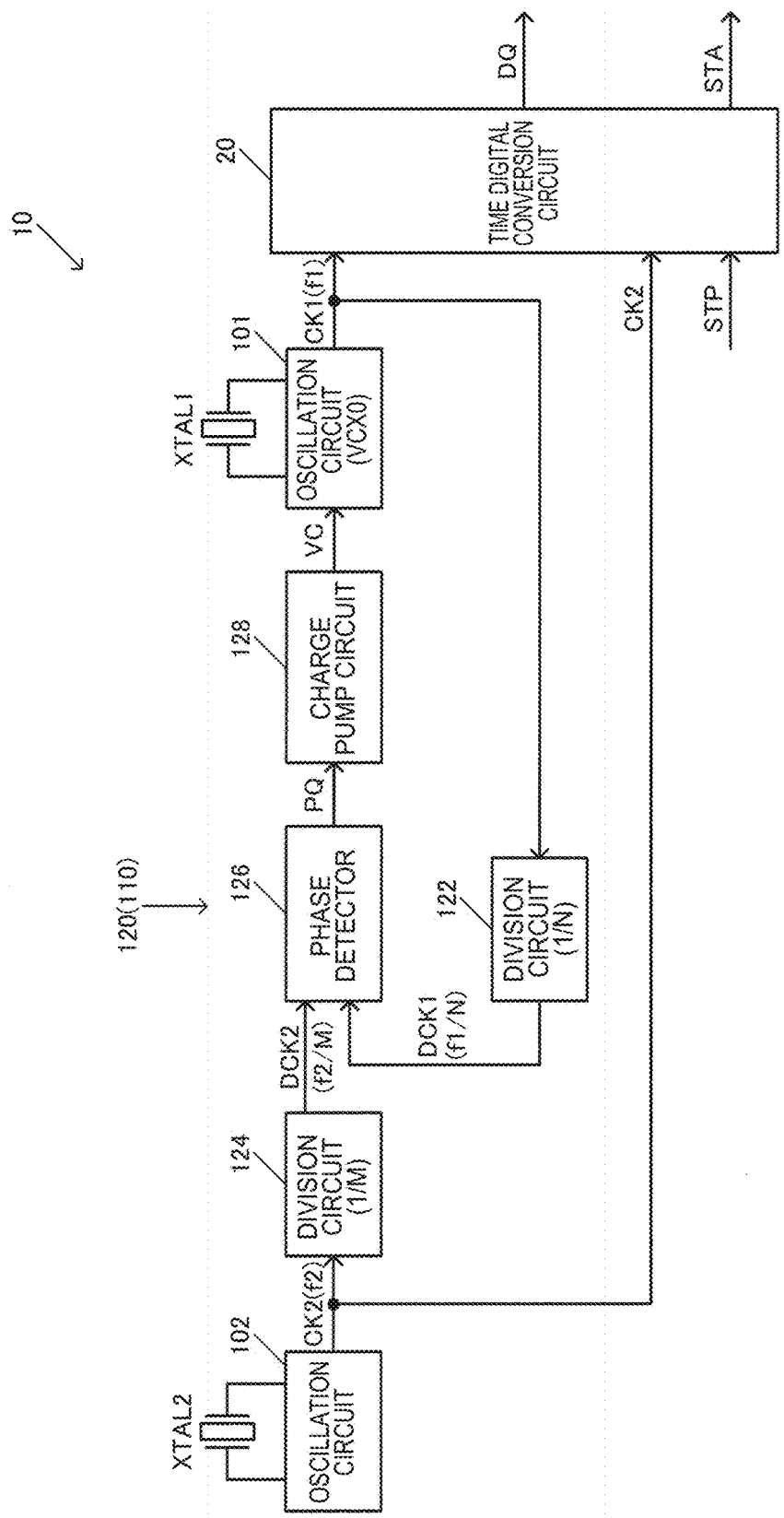
FIG. 14 is a diagram illustrating a second configuration example of the synchronization circuit.

FIG. 14 illustrates a second configuration example of the synchronization circuit 110. In FIG. 14, the PLL circuit 120 is used as the synchronization circuit 110. That is, the circuit device 10 in FIG. 14 includes the time-to-digital conversion circuit 20 and the PLL circuit 120. The clock signal CK1 with the clock frequency f1 generated using the oscillation element XTAL1 and the clock signal CK2 with the clock frequency f2 generated using the oscillation element XTAL2 are input and the time-to-digital conversion circuit 20 converts a time into a digital value using the clock signals CK1 and CK2. Then, the PLL circuit 120 synchronizes the phases of the clock signals CK1 and CK2.

Specifically, the PLL circuit 120 synchronizes the phases of the clock signals CK1 and CK2 so that the frequency difference between the clock frequencies f1 and f2 is a frequency difference corresponding to the resolution of the time-to-digital conversion. For example, the resolution of the time-to-digital conversion according to the embodiment is expressed as $\Delta t = |1/f1 - 1/f2| = |f1 - f2|/(f1 \times f2)$. The PLL circuit 120 synchronizes the phases of the clock signals CK1 and CK2 so that the frequency difference $|f1-f2|$ between the clock frequencies f1 and f2 is the frequency difference corresponding to the resolution $\Delta t = |f1-f2|/(f1 \times f2)$ of the time-to-digital conversion.

Specifically, as illustrated in FIG. 14, the PLL circuit 120 includes division circuits 122 and 124 (first and second division circuits) and a phase detector 126 (a phase comparator). The division circuit 122 divides the clock signal CK1 and outputs a divided clock signal DCK1 (a first divided clock signal). Specifically, the division circuit 122 performs division so that the clock frequency f1 of the clock signal CK1 becomes 1/N and outputs the divided clock signal DCK1 with the clock frequency of f1/N.

The division circuit 124 divides the clock signal CK2 and outputs a divided clock signal DCK2 (a second divided clock signal). Specifically, the division circuit 124 performs division so that the clock frequency f2 of the clock signal CK2 becomes 1/M and outputs the divided clock signal DCK2 with the clock of becomes f2/M. For example, the circuit device 10 includes the oscillation circuit 102. The oscillation circuit 102 oscillates the oscillation element XTAL2, generates the clock signal CK2, and outputs the clock signal CK2 to the division circuit 124. Then, the phase detector 126 compares the phases the divided clock signal DCK1 and the divided clock signal DCK2.

The circuit device 10 includes the oscillation circuit 101. The oscillation circuit 101 is controlled based on a phase comparison result of the phase detector 126 of the PLL circuit 120 and oscillates the oscillation element XTAL1. The oscillation circuit 101 is also a constituent element of the PLL circuit 120, for example. Specifically, the oscillation circuit 101 is, for example, a voltage-controlled oscillation circuit (VCXO) of which an oscillation frequency is controlled through voltage control. The PLL circuit 120 includes a charge pump circuit 128. The phase detector 126 outputs a signal PQ which is the phase comparison result to the charge pump circuit 128. The signal PQ is, for example, an up/down signal. The charge pump circuit 128 outputs a control voltage VC based on the signal PQ to the oscillation circuit 101. For example, the charge pump circuit 128 includes a loop filter. The up/down signal which is the signal PQ is converted into the control voltage VC by the loop filter. The oscillation circuit 101 performs an oscillation operation of the oscillation element XTAL1 of which an oscillation frequency is controlled based on the control voltage VC to generate the clock signal CK1. For example, the oscillation circuit 101 includes a variable capacitance circuit. The oscillation frequency is controlled by controlling a capacitance value of the variable capacitance circuit based on the control voltage VC.

In the second configuration example of FIG. 14, the phase synchronization of the clock signals CK1 and CK2 can be realized by effectively using the PLL circuit 120. That is, as in FIG. 13, it is possible to realize the phase synchronization in which the transition timings of the clock signals CK1 and CK2 are matched at each phase synchronization timing.

As described above, when the synchronization circuit 110 is included in the circuit device 10, it is possible to match the transition timings of the clock signals CK1 and CK2 at each phase synchronization timing. Accordingly, since circuit processing can start using the phase synchronization timing as a reference timing, simplification of circuit processing or the circuit configuration is achieved. It is possible to start the process for the time-to-digital conversion immediately from the phase synchronization timing by the synchronization circuit 110 without waiting for accidental matching of the transition timings of the clock signals CK1 and CK2. Accordingly, acceleration of the time-to-digital conversion is achieved. By including the synchronization circuit 110, it is possible to minimize an error caused due to a time difference between the transition timings of the clock signals CK1 and CK2 at the phase synchronization timing. Accordingly, an error occurring systematically due to the time difference is sufficiently reduced and an improvement in precision is achieved.

For example, in the scheme of the related art of the above-described JP-A-5-87954, matching of edges of first and second clock pulses is detected by an edge matching detection circuit and time measurement starts under the condition that the matching of the edges is detected. In the scheme of the related art, however, the time measurement may not start as long as the matching of the edges of the first and second clock pulses is not detected. Therefore, there is a first problem that start of the time measurement may be late and a conversion time of time-to-digital conversion becomes long. When a relation between clock frequencies of the first and second clock pulses is a relation between frequencies in which edges are not matched at a synchronization point, the edges are matched only accidentally. Thus, there is a second problem that it is difficult to realize the time-to-digital conversion. Since a timing of the synchronization point of the first and second clock pulses may not be confirmed systematically, there is a third problem that circuit processing or a circuit configuration may be complicated. Further, when there is an error in the detection of the matching of the edges of the first and second clock pulses, there is a fourth problem that precision may degrade due to the error.

In contrast, in the embodiment, by including the synchronization circuit 110, it is possible to forcibly match the transition timings of the clock signals CK1 and CK2 at each phase synchronization timing. Accordingly, since the process for the time-to-digital conversion can start immediately after the phase synchronization timing, the above-described first problem of the scheme of the related art can be resolved. According to the embodiment, even when the relation between the clock frequencies of the clock signals CK1 and CK2 is the relation between the frequencies in the transition timings are not matched, the transition timings of the clock signals CK1 and CK2 are forcibly matched at each phase synchronization timing by the synchronization circuit 110. Accordingly, the second problem of the scheme of the related art can be resolved. Since the phase synchronization timing can be confirmed systematically through the phase synchronization of the synchronization circuit 110, circuit processing or the circuit device can be simplified, and thus the third problem of the scheme of the related art can be resolved. By matching the transition timings of the clock signals CK1 and CK2 at each phase synchronization timing, a conversion error caused due to a deviation between the transition timings of the clock signals CK1 and CK2 can be reduced, and thus the fourth problem of the scheme of the related art can also be resolved.

4. Scheme of Updating Clock Cycle Designation Value

A scheme of transitioning the signal level of the signal STA based on the clock signal CK1 and comparing the phases of the signal STP and the clock signal CK2 is not limited to the schemes described with reference to FIGS. 1 to 11, but various modifications can be realized. First, a scheme of realizing the time-to-digital conversion by updating the clock cycle designation value (in a broad sense, clock cycle designation information) will be described as a scheme of a modification example.

Figure 15:
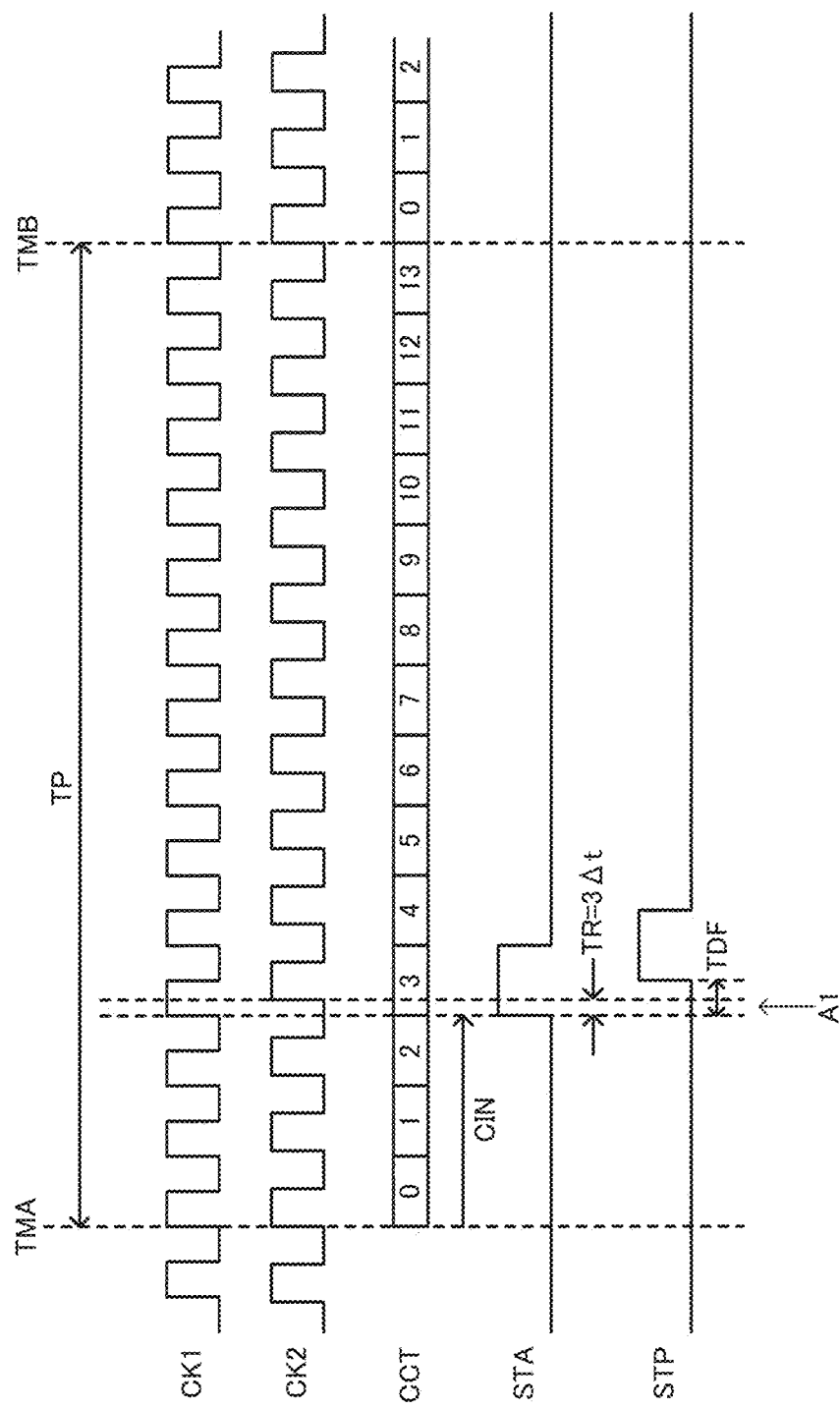
FIG. 15 is a diagram illustrating signal waveforms for describing a scheme of updating a clock cycle designation value.
Figure 16:
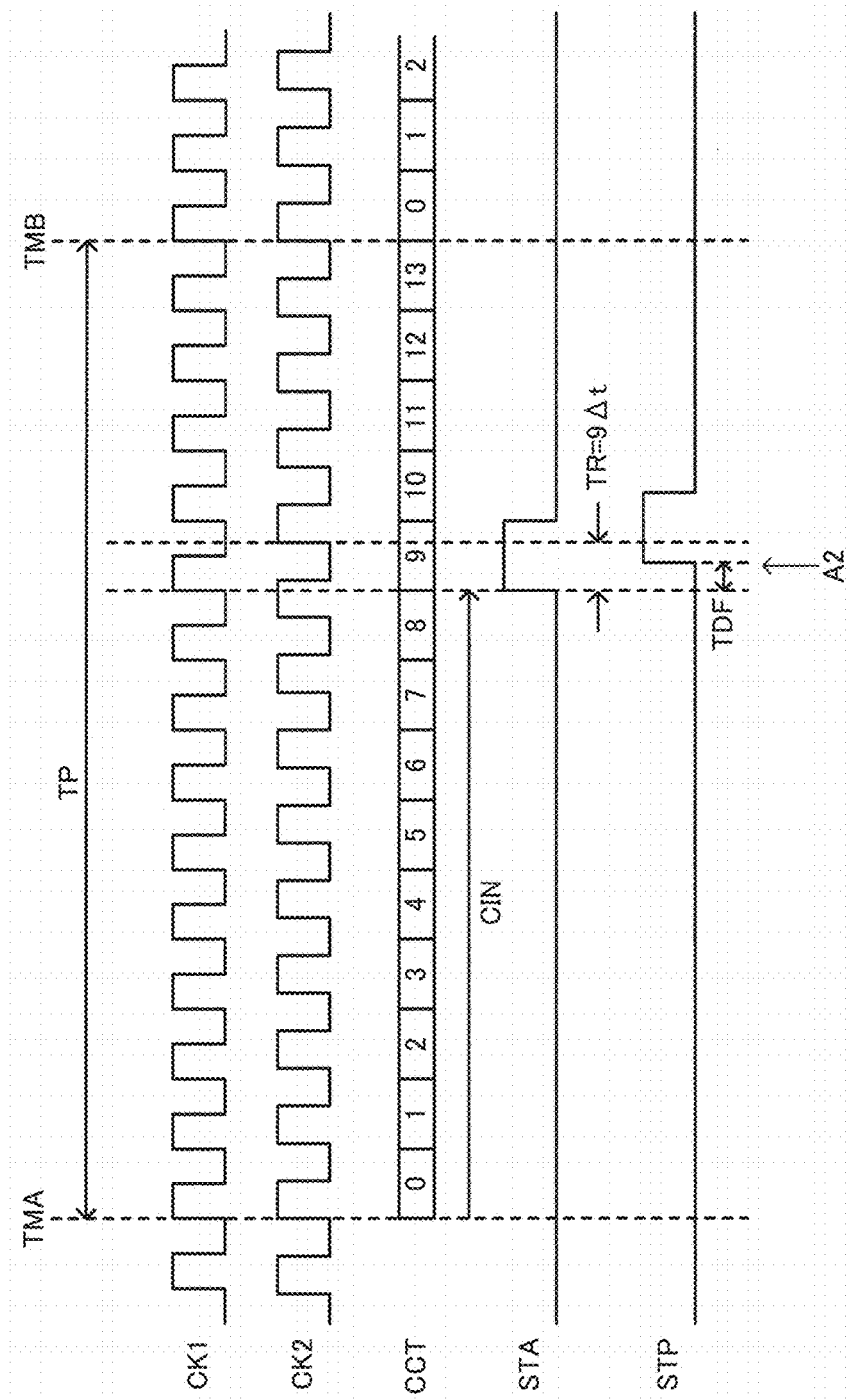
FIG. 16 is a diagram illustrating signal waveforms for describing the scheme of updating the clock cycle designation value.
Figure 17:
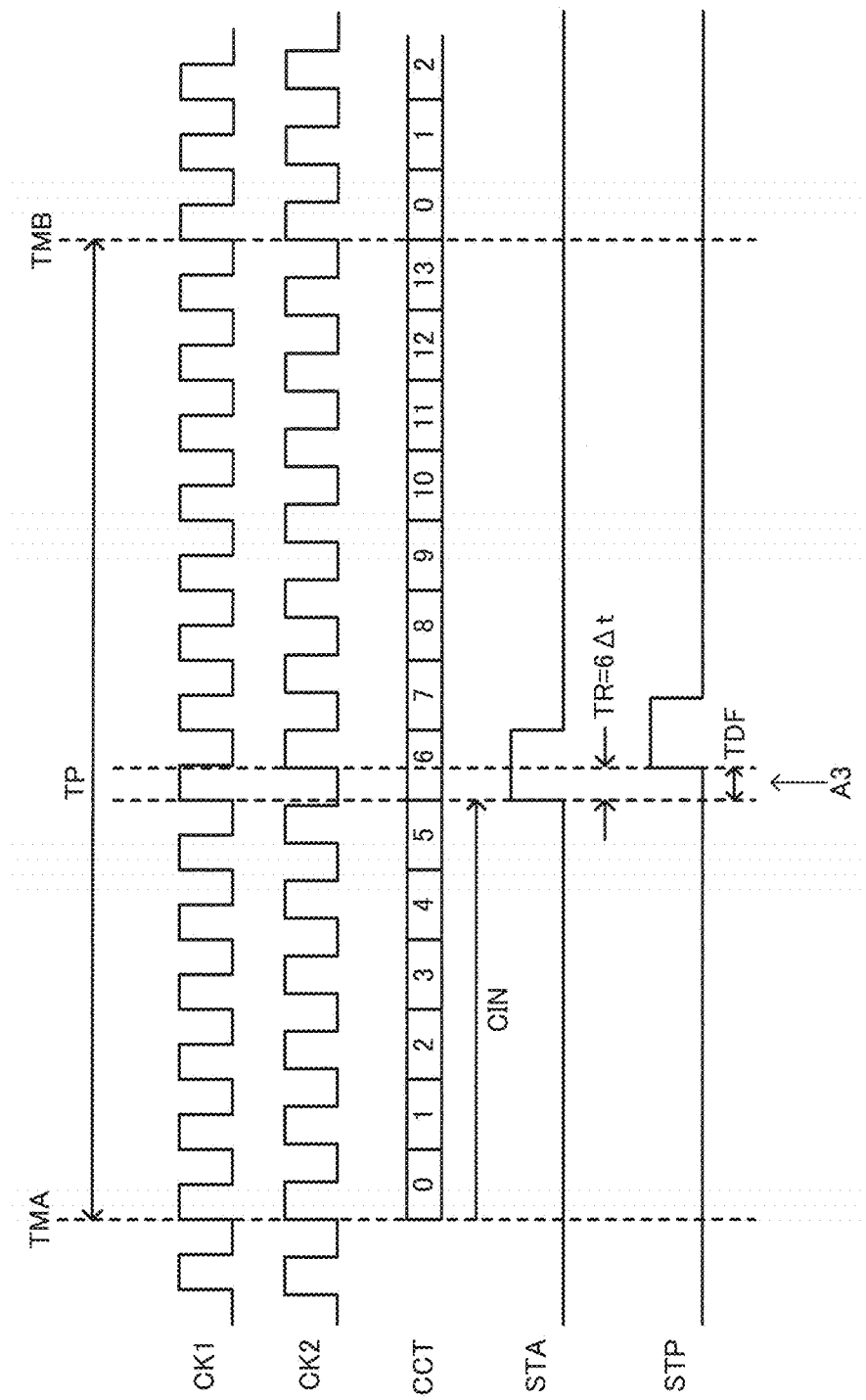
FIG. 17 is a diagram illustrating signal waveforms for describing the scheme of updating the clock cycle designation value.

FIGS. 15 to 17 are diagrams illustrating signal waveforms for describing an updating scheme for the clock cycle designation value (hereinafter simply referred to as an updating scheme). CIN is clock cycle designation information. Hereinafter, the description will be made assuming CIN is a clock cycle designation value indicated by the clock cycle designation information.

TMA and TMB are phase synchronization timings. In FIGS. 15 to 17, the phase synchronization timings TMA and TMB are timings at which the transition timings (rising edges) of the clock signals CK1 and CK2 match. However, the updating scheme according to the embodiment is not limited thereto. The phase synchronization timings TMA and TMB may be timings at which the phase anteroposterior relation between the clock signals CK1 and CK2 is switched. The timing at which the phase anteroposterior relation is switched is a timing at which a state in which the phase of one clock signal is in front of the phase of the other clock signal is switched to a state in which the phase of the one clock signal is behind the phase of the other clock signal.

An updating period TP is a period between the phase synchronization timings TMA and TMB. In the updating scheme according to the embodiment, the clock cycle designation value is updated, for example, once during the updating period TP. FIGS. 15 to 17 illustrate a case in which the number of clocks of the clock signal CK1 during the updating period TP is 14 to facilitate the description. However, in order to set a high resolution, the number of clocks during the updating period TP is actually set to, for example, a considerably large number such as 1000 or more (or 5000 or more).

During the updating period TP (a first updating period) of FIG. 15, the clock cycle designation value is set to CIN=3. Accordingly, the signal level of the signal SAT is transitioned at a clock cycle (CCT=3) designated with CIN=3. In this way, in the updating scheme according to the embodiment, the signal level of the signal STA is transitioned at the clock cycle of the clock signal CK1 designated based on the clock cycle designation value CIN (the clock cycle designation information). As described with reference to FIGS. 3 and 4, the signal level of the signal STP is transitioned to correspond to the signal STA and the time difference between the transition timings of the signals STA and STP is TDF.

On the other hand, at the clock cycle (CCT=3) designated with CIN=3, as described with reference to FIG. 2, the inter-clock time difference which is the time difference between the transition timings of the clock signals CK1 and CK2 is $TR=CIN \times \Delta t=3\Delta t$.

In this case, in the updating scheme according to the embodiment, as indicated by A1 of FIG. 15, the phases of the signal STP and the clock signal CK2 are compared. The phase comparison can be realized, for example, by sampling one of the signal STP and the clock signal CK2 with the other signal.

In A1 of FIG. 15, a result of the phase comparison which is a result obtained by sampling the signal STP with the clock signal CK2 is at the L level. In accordance with the result of the phase comparison, the phase of the signal STP is determined to be behind the phase of the clock signal CK2. In other words, in A1 of FIG. 15, TDF>TR=3Δt is set and the time difference TDF between the transition timings of the signals STA and STP is longer than the inter-clock time difference TR=3Δt between the clock signals CK1 and CK2. In this case, updating is performed to increase the clock cycle designation value CIN.

During the updating period TP (the second updating period) of FIG. 16, the clock cycle designation value is set to CIN=9. For example, during the previous updating period TP illustrated in FIG. 15, updating is performed to increase the clock cycle designation value from CIN=3 to CIN=9, as described above. Accordingly, the signal level of the signal SAT is transitioned at a clock cycle (CCT=9) designated with CIN=9. The signal level of the signal STP is transitioned to correspond to the signal STA and the time difference between the transition timings of the signals STA and STP is TDF.

On the other hand, at the clock cycle (CCT=9) designated with CIN=9, the inter-clock time difference between the clock signals CK1 and CK2 is TR=CIN×Δt=9Δt.

In this case, in the updating scheme according to the embodiment, as indicated by A2 of FIG. 16, the phases of the signal STP and the clock signal CK2 are compared. In this case, since a result of the phase comparison which is a result obtained by sampling the signal STP with the clock signal CK2 is the H level, the phase of the signal STP is determined to be in front of the phase of the clock signal CK2. In other words, in A2 of FIG. 16, TDF<TR=9Δt is set and the time difference TDF is shorter than the inter-clock time difference TR=9Δt. In this case, updating is performed to decrease the clock cycle designation value CIN.

During the updating period TP (the third updating period) of FIG. 17, the clock cycle designation value is set to CIN=6. For example, during the previous updating period TP illustrated in FIG. 16, updating is performed to decrease the clock cycle designation value from CIN=9 to CIN=6, as described above. Accordingly, the signal level of the signal SAT is transitioned at a clock cycle (CCT=6) designated with CIN=6. The signal level of the signal STP is transitioned to correspond to the signal STA and the time difference between the transition timings of the signals STA and STP is TDF.

On the other hand, at the clock cycle (CCT=6) designated with CIN=6, the inter-clock time difference between the clock signals CK1 and CK2 is TR=CIN×Δt=6Δt.

In this case, in the updating scheme according to the embodiment, as indicated by A3 of FIG. 17, the phases of the signal STP and the clock signal CK2 are compared. In this case, in A3 of FIG. 17, the transition timings (the phases) of the signal STP and the clock signal CK2 match (substantially match). In other words, in A3 of FIG. 17, TDF=TR=6Δt is set. Accordingly, in this case, the digital value corresponding to DQ=TR=6Δt is output as the digital value for converting the time difference TDF between the signals STA and STP and a final result.

In FIGS. 15 to 17, to facilitate the description, an increase or decrease value of the clock cycle designation value CIN during each updating period is a value greater than 1. However, the increase or decrease value of the clock cycle designation value CIN may be actually set to 1 or GK which is a small value equal to or less than 1 as in Δ sigma type A/D conversion. GK is a gain coefficient and a value satisfying GK≤1.

For example, in FIGS. 15 and 16, the clock cycle designation value CIN is increased from 3 to 9. However, the updating is actually performed to increase the clock cycle designation value CIN by a given value GK, for example, during each updating period. For example, when GK is the gain coefficient satisfying GK≤1, updating is performed to set the clock cycle designation value CIN to +GK. When GK=0.1 is set and the updating of +GK is continued, for example, 10 times, the clock cycle designation value CIN increases by 1.

In FIGS. 16 and 17, the clock cycle designation value CIN decreases from 9 to 6. However, the updating is actually performed to decrease the clock cycle designation value CIN by the given value GK, for example, during each updating period. For example, updating is performed to set the clock cycle designation value CIN to −GK. When GK=0.1 is set and the updating of −GK is continued, for example, 10 times, the clock cycle designation value CIN decreases by 1.

In A3 of FIG. 17, even after the transition timings of the signal STP and the clock signal CK2 substantially match, the clock cycle designation value CIN is updated. For example, CIN is assumed to be changed like 6, 7, 6, 7, and the like. In this case, the digital value DQ output as a final result can be set to a value between 6Δt and 7Δt (for example, 6.5×Δt). In this way, in the updating scheme according to the embodiment, an actual resolution can also be decreased as in Δ sigma type A/D conversion.

In the updating scheme according to the embodiment, as described above, the phases of the signal STP of which the signal level is transitioned to correspond to the signal STA and the clock signal CK2 are compared and the clock cycle designation value CIN with which the signal level of the signal STA is transitioned is updated based on the result of the phase comparison.

Specifically, the signal level of the signal STA is changed at the clock cycle designated with the clock cycle designation value CIN. For example, in FIG. 15, the signal level of the signal STA is transitioned at the clock cycle designated with CIN=3. In FIG. 16, the signal level of the signal STA is transitioned at the clock cycle designated with CIN=9. The same applies to FIG. 17.

When the signal level of the signal STP is transitioned to correspond to the signal STA, the phases of the signal STP and the clock signal CK2 are compared and the clock cycle designation value CIN is updated based on the phase comparison result. For example, since the result of the phase comparison in which the phase of the signal STA is behind the phase of the clock signal CK2 is obtained in FIG. 15, CIN=3 in FIG. 15 is updated to CIN=9 in FIG. 16. Since the result of the phase comparison in which the phase of the signal STA is in front of the phase of the clock signal CK2 is obtained in FIG. 16, CIN=9 in FIG. 16 is updated to CIN=6 in FIG. 17. The final value of the clock cycle designation value CIN updated in this way is output as the digital value DQ of the time difference TDF between the signals STA and STP.

In the updating scheme according to the embodiment, the clock cycle designation value CIN is updated during each updating period. Then, the updated clock cycle designation value CIN is fed back. Accordingly, even when a time or a physical quantity which is a measurement target is dynamically changed, the time-to-digital conversion following the dynamic change can be realized. For example, as indicated in A3 of FIG. 17, when a measurement target time becomes close to the clock cycle designation value CIN corresponding to the time (the time difference TDF) and subsequently the time is dynamically changed, the clock cycle designation value CIN is sequentially updated in accordance with the dynamic change to correspond to the dynamic change.

In the updating scheme according to the embodiment, when an error component caused due to mismatch of the transition timings of the clock signals CK1 and CK2 is reduced, the time-to-digital conversion circuit 20 preferably performs a process of converting the time difference to the digital value DQ based on the clock cycle designation value and information regarding the number of clocks of the clock signals CK1 and CK2 during the updating period of the clock cycle designation value. For example, the digital value DQ is calculated by updating the clock cycle designation value CIN based on the result of the phase comparison of the signal STP and the clock signal CK2 and the information regarding the number of clocks.

That is, in the updating scheme according to the embodiment, even when the transition timings of the clock signals CK1 and CK2 do not precisely match at the phase synchronization timing, the time-to-digital conversion can be realized. For example, in the updating scheme according to the embodiment, the phase synchronization timings TMA and TMB may be timings at which the phase anteroposterior relation between the clock signals CK1 and CK2 is switched and the transition timings of the clock signals CK1 and CK2 may not completely match. That is, in the embodiment, a modification can also be realized in which the synchronization circuit 110 is not included.

For example, to precisely match the transition timings of the clock signals CK1 and CK2 at the phase synchronization timing, a relation of N/f1=M/f2 should be satisfied. Here, N and M are the numbers of clocks of the clock signals CK1 and CK2 during an updating period, respectively, and are integers equal to or greater than 2. Incidentally, it may be difficult in some cases to set a frequency at which the clock frequencies f1 and f2 in the oscillation elements XTAL1 and XTAL2 in FIG. 1 precisely satisfy the relation of N/f1=M/f2. When the relation of N/f1=M/f2 is not satisfied and the synchronization circuit 110 is not included, deviation occurs between the transition timings of the clock signals CK1 and CK2 at the phase synchronization timings TMA and TMB. Thus, there is a concern of the deviation becoming a conversion error.

Accordingly, in the updating scheme according to the embodiment, the number of clocks N during each updating period is measured. When the deviation occurs between the transition timings of the clock signals CK1 and CK2 at the phase synchronization timings TMA and TMB, the number of clocks N is not usually the same number, and thus is changed in accordance with the updating period. The time-to-digital conversion circuit 20 updates the clock cycle designation value CIN based on the number of clocks N changed in this way and the result of the phase comparison of the signal STP and the clock signal CK2. In this way, it is possible to reduce the conversion error caused due to the deviation between the transition timings of the clock signals CK1 and CK2 at the phase synchronization timings TMA and TMB.

5. Binary Searching Scheme

Next, a binary searching scheme will be described as a second modification example of the scheme of transitioning the signal level of the signal STA based on the clock signal CK1 and comparing the phases of the signal STP and the clock signal CK2.

Figure 18:
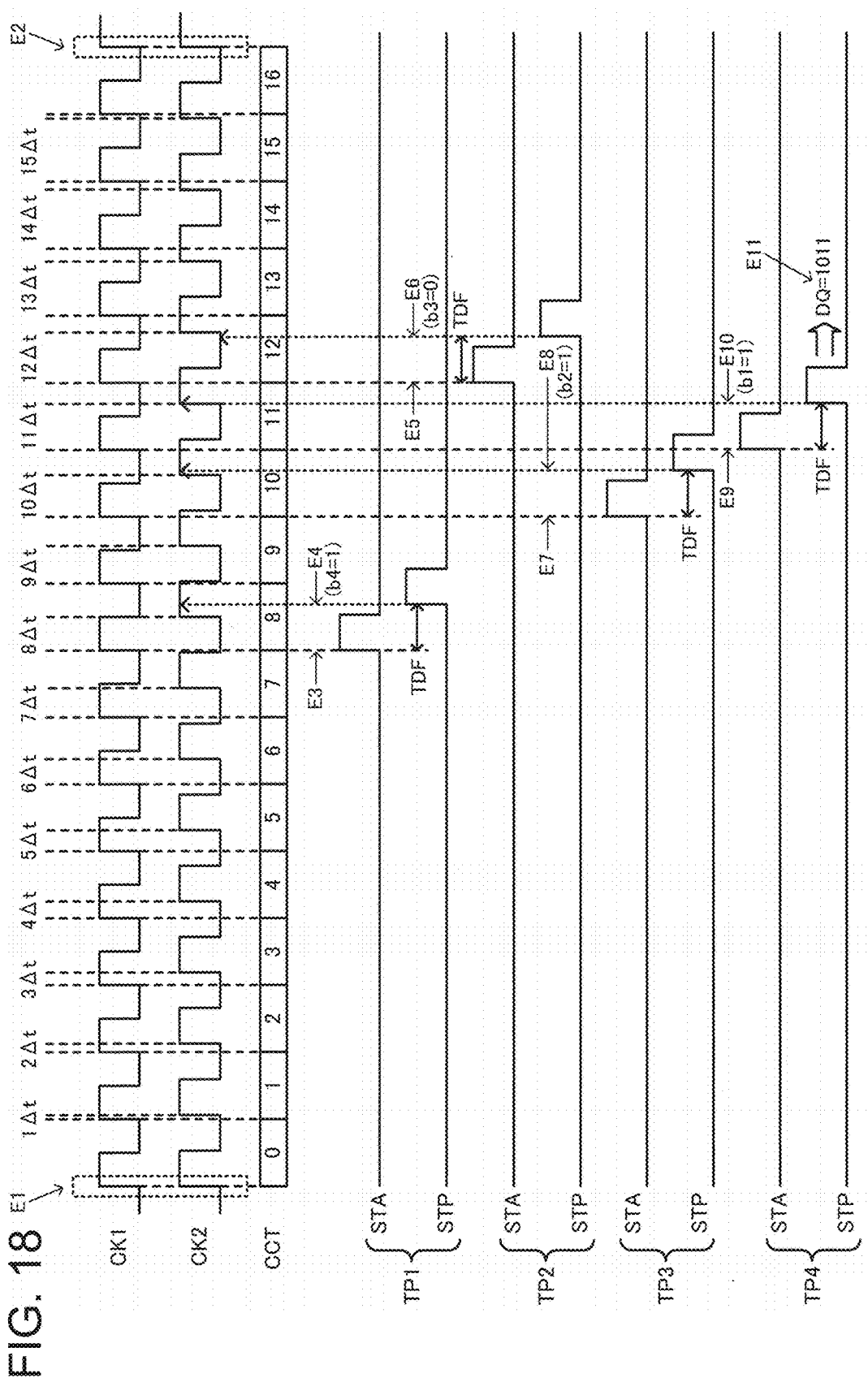
FIG. 18 is a diagram illustrating signal waveforms for describing a binary searching scheme.

FIG. 18 is a diagram illustrating signal waveforms for describing the binary searching scheme. In FIG. 18, a digital value corresponding to a time difference between the transition timings of the signals STA and STP is calculated with a resolution corresponding to the frequency difference between the clock frequencies f1 and f2 by binary searching. Specifically, the updating of the clock cycle designation value CIN based on the result of the phase comparison of the signal STP and the clock signal CK2 is realized by the binary searching.

The binary searching (a dichotomizing search or bisection method) is a method of calculating a final digital value by sequentially dividing (two-division) a searching range and narrowing the searching range. For example, the digital value DQ obtained by converting the time difference is assumed to be 4-bit data and 4 bits are assumed to be b4, b3, b2, and b1. Here, b4 is the MSB and b1 is the LSB. In FIG. 18, the bits b4, b3, b2, and b1 of the digital value DQ is obtained by the binary searching. For example, the bits b4, b3, b2, and b1 of the digital value DQ are sequentially calculated by the same scheme as A/D conversion of sequential comparison.

For example, in FIG. 18, the clock frequencies of the clock signals CK1 and CK2 are, for example, f1=100 MHz (a period=10 ns) and f2=94.12 MHz (a period=10.625 ns) and the resolution is $\Delta t$=0.625 ns. E1 and E2 in FIG. 18 are phase synchronization timings and are, for example, timings at which the transition timings of the clock signals CK1 and CK2 match. The clock cycle designation value CIN is set to, for example, CIN=8 which is an initial value. CIN=8 which is the initial value is equivalent to, for example, a value near the middle of the initial searching range.

In this way, when CIN=8 is set, the signal level of the signal STA is transitioned during the initial updating period TP1 (the first updating period) when the clock cycle value is CCT=8, as indicated by E3 of FIG. 18. When the signal level of the signal STP is transitioned to correspond to the signal STA, the phases of the signal STP and the clock signal CK2 are compared. For example, the phase comparison in which the clock signal CK2 is sampled with the signal STP is performed, the H level of the clock signal CK2 is sampled, as indicated by E4, and the H level is the result of the phase comparison. In this way, when the result of the phase comparison is the H level, a logic level of the bit b4 which is the MSB of the digital value DQ is determined to be b4=1.

In this way, when b4=1 is calculated, the searching range of the binary searching is narrowed and CIN corresponding to the final digital value DQ is determined to be within a searching range of, for example, 8 to 15. Then, the clock cycle designation value is updated to, for example, CIN=12 so that a value (for example, a value near the middle) within the searching range is set.

In this way, when the clock cycle designation value is updated to CIN=12, the signal level of the signal STA is transitioned during the updating period TP2 (the second updating period) subsequent to the updating period TP1, as indicated by E5, when the clock cycle value is CCT=12. Then, the phases of the signal STP and the clock signal CK2 are compared. For example, as indicated by E6, the L level of the clock signal CK2 is sampled. Therefore, the L level is the result of the phase comparison. In this way, when the result of the phase comparison is the L level, the logic level of the subsequent bit b3 of the digital value DQ is determined to be b3=0.

In this way, the searching range of the binary searching is narrowed by calculating b4=1 and b3=0, CIN corresponding to the final digital value DQ is determined to be within a searching range of, for example, 8 to 11. Then, the clock cycle designation value is updated to, for example, CIN=10 so that a value (for example, a value near the middle) within the searching range is set.

In this way, when the clock cycle designation value is updated to CIN=10, the signal level of the signal STA is transitioned during the updating period TP3 (the third updating period) subsequent to the updating period TP2, as indicated by E7, when the clock cycle value is CCT=10. Then, the phases of the signal STP and the clock signal CK2 are compared. For example, as indicated by E8, the H level of the clock signal CK2 is sampled. Therefore, the H level is the result of the phase comparison. In this way, when the result of the phase comparison is the H level, the logic level of the subsequent bit b2 of the digital value DQ is determined to be b2=1.

Finally, the cock cycle designation value is updated to CIN=11 and the signal level of the signal STA is transitioned during the updating period TP4 (the fourth updating period) subsequent to the updating period TP3, as indicated by E9, when the clock cycle value is CCT=11. Then, the phases of the signal STP and the clock signal CK2 are compared. For example, as indicated by E10, the H level of the clock signal CK2 is sampled. Therefore, the H level is the result of the phase comparison. In this way, when the result of the phase comparison is the H level, bit b1 which is the LSB of the digital value DQ is set to b1=1. Then, as indicated by E11, DQ=1011 (binary numbers) is output as an output code which is the final digital value.

When the binary searching scheme is used, the digital value DQ corresponding to the time difference between the transition timings of the signals STA and STP can be calculated at a high speed. For example, in the scheme of the related art of the above-described JP-A-5-87954, time measurement of 15 times is necessary to the maximum in order to calculate the final digital value DQ in the case of FIG. 18. In contrast, in the scheme according to the embodiment, as illustrated in FIG. 18, the final digital value DQ can be calculated during the updating periods of, for example, 4 times. Thus, acceleration of the time-to-digital conversion is achieved.

In particular, when the resolution Δt is decreased and the number of bits L of the digital value DQ is increased, for example, time measurement of about $2^L$ is necessary in the scheme of the related art. Thus, the conversion time may become considerably long. In contrast, in the scheme according to the embodiment, the final digital value DQ can be calculated during the updating periods of, for example, L times. Thus, considerable acceleration of the time-to-digital conversion is achieved compared to the scheme of the related art.

The high-order bit side of the digital value DQ may be calculated by the binary searching scheme of FIG. 18, and subsequently the low-order bit side (for example, low-order bits including the LSB or the low-order bit of the LSB) may be calculated by, for example, the updating scheme described with reference to FIGS. 15 to 17. For example, in FIG. 18, the clock cycle designation value CIN is updated so that a value within the searching range is obtained while sequentially narrowing the searching range (sequential comparison range) as in sequential comparison type A/D conversion. On the other hand, in the updating scheme of FIGS. 15 to 17, the updating is performed to increase or decrease CIN by ±GK based on the result of the phase comparison as in Δ sigma type A/D conversion. GK is the gain coefficient and GK≤1 is satisfied. Specifically, in the case of the result of the phase comparison in which the phase of the signal STP is behind the phase of the clock signal CK2, updating (a digital arithmetic process) is performed to increase CIN by +GK. Conversely, in the case of the result of the phase comparison in which the phase of the signal STP is in front of the phase of the clock signal CK2, updating (a digital arithmetic process) is performed to decrease CIN by −GK. In this way, by combining the two schemes, it is possible to achieve compatibility of acceleration and high precision of the time-to-digital conversion.

6. Other Configuration Examples

Figure 19:
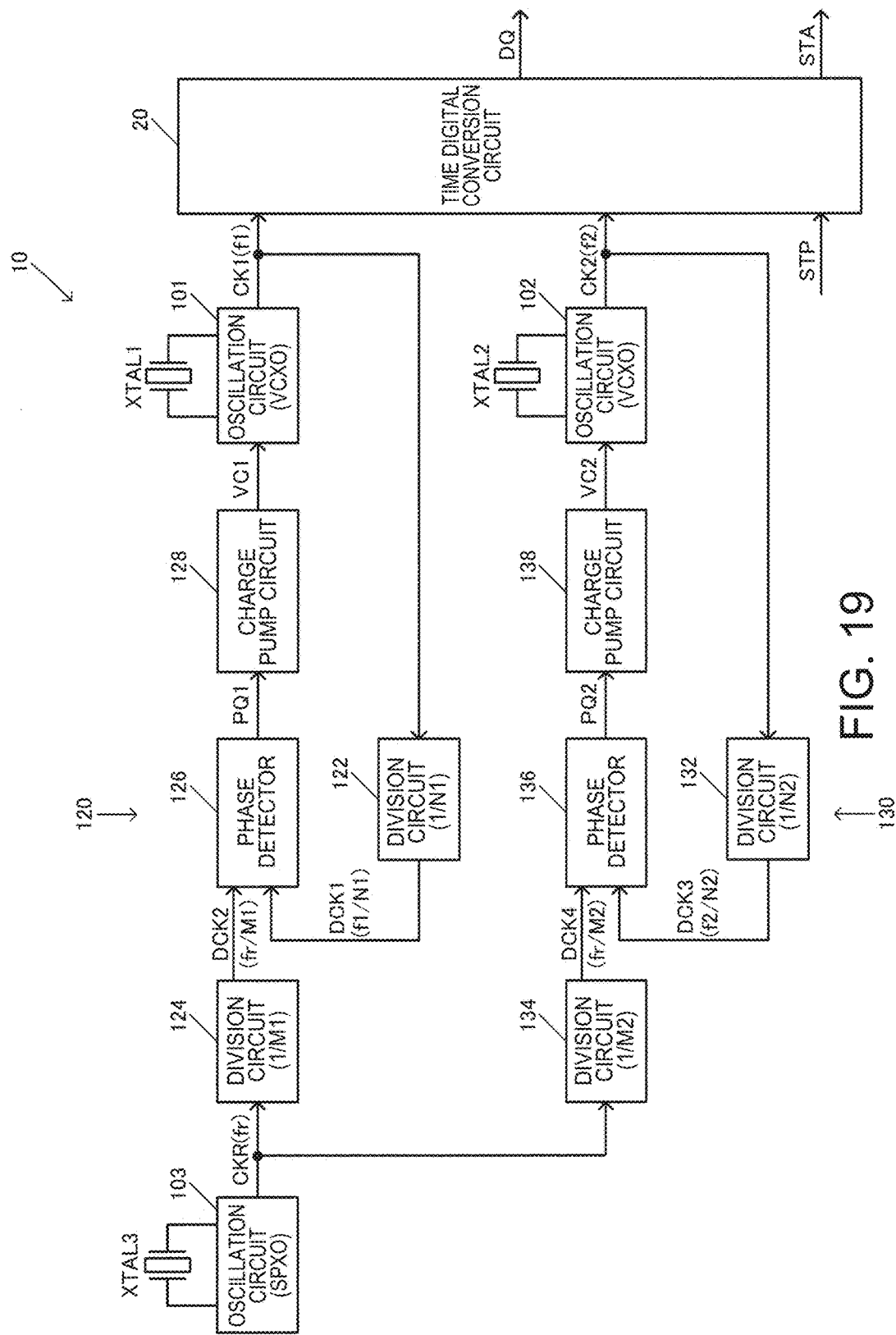
FIG. 19 is a diagram illustrating another configuration example of the circuit device according to an embodiment.

FIG. 19 is a diagram illustrating another configuration example of the circuit device 10 according to the embodiment. In the circuit device 10 in FIG. 19, a plurality of PLL circuits 120 and 130 are installed as the synchronization circuit 110 in FIG. 1.

The PLL circuit 120 (a first PLL circuit) synchronizes the phases of the clock signal CK1 and a reference clock signal CKR. Specifically, the clock signal CK1 with the clock frequency f1 generated using the oscillation element XTAL1 (the first resonator) and the reference clock signal CKR are input to the PLL circuit 120. Then, the PLL circuit 120 synchronizes the phases of the clock signal CK1 and the reference clock signal CKR. For example, the PLL circuit 120 synchronizes the phases (matches the transition timings) of the clock signal CK1 and the reference clock signal CKR at each first phase synchronization timing (each first period).

The PLL circuit 130 (the second PLL circuit) synchronizes the phases of the clock signal CK2 and the reference clock signal CKR. Specifically, the clock signal CK2 with the clock frequency f2 generated using the oscillation element XTAL2 (the second oscillation element) and the reference clock signal CKR are input to the PLL circuit 130. Then, the PLL circuit 130 synchronizes the phases of the clock signal CK2 and the reference clock signal CKR. For example, the PLL circuit 130 synchronizes the phases (matches the transition timings) of the clock signal CK2 and the reference clock signal CKR at each second phase synchronization timing (each second period).

The reference clock signal CKR is generated, for example, by causing the oscillation circuit 103 to oscillate an oscillation element XTAL3 (a third oscillation element). A clock frequency fr is a different frequency from the clock frequencies f1 and f2 of the clock signals CK1 and CK2 and is, for example, a lower frequency than the clock frequencies f1 and f2. As the oscillation element XTAL3, the same element as the oscillation element XTAL1 or XTAL2 can be used. For example, a quartz crystal resonator can be used. The quartz crystal resonator can be used to generate the reference clock signal CKR with high precision in which jitter or a phase error is small. As a result, jitter or a phase error of the clock signals CK1 and CK2 can also be reduced, and thus high precision time-to-digital conversion is achieved.

In this way, in the embodiment, the phases of the clock signal CK1 and the reference clock signal CKR are synchronized by the PLL circuit 120 and the phases of the clock signal CK2 and the reference clock signal CKR are synchronized by the PLL circuit 130. Thus, the phases of the clock signals CK1 and CK2 are synchronized. A modification can also be realized in which three or more PLL circuits (three or more oscillation elements) are included to synchronize the phases of the clock signals CK1 and CK2.

Specifically, the PLL circuit 120 includes division circuits 122 and 124 (first and second division circuits) and a phase detector 126 (a first phase comparator). The division circuit 122 performs division so that the clock frequency f1 of the clock signal CK1 becomes 1/N1 and outputs the divided clock signal DCK1 with the clock frequency of f1/N1. The division circuit 124 performs division so that the clock frequency fr of the reference clock signal CKR becomes 1/M1 and outputs the divided clock signal DCK2 with the clock frequency of fr/M1. Then, the phase detector 126 compares the phases of the divided clock signal DCK1 and the divided clock signal DCK2 and outputs the signal PQ1 which is an up/down signal to the charge pump circuit 128. Then, the oscillation circuit 101 (VCXO) performs an oscillation operation of the oscillation element XTAL1 of which an oscillation frequency is controlled based on the control voltage VC1 from the charge pump circuit 128 to generate the clock signal CK1.

The PLL circuit 130 includes division circuits 132 and 134 (third and fourth division circuits) and a phase detector 136 (a second phase comparator). The division circuit 132 performs division so that the clock frequency f2 of the clock signal CK2 becomes 1/N2 and outputs the divided clock signal DCK3 with the clock frequency of f2/N2. The division circuit 134 performs division so that the clock frequency fr of the reference clock signal CKR becomes 1/M2 and outputs the divided clock signal DCK4 with the clock frequency of fr/M2. Then, the phase detector 136 compares the phases of the divided clock signal DCK3 and the divided clock signal DCK4 and outputs the signal PQ2 which is an up/down signal to the charge pump circuit 138. Then, the oscillation circuit 102 (VCXO) performs an oscillation operation of the oscillation element XTAL2 of which an oscillation frequency is controlled based on the control voltage VC2 from the charge pump circuit 138 to generate the clock signal CK2.

Figure 20:
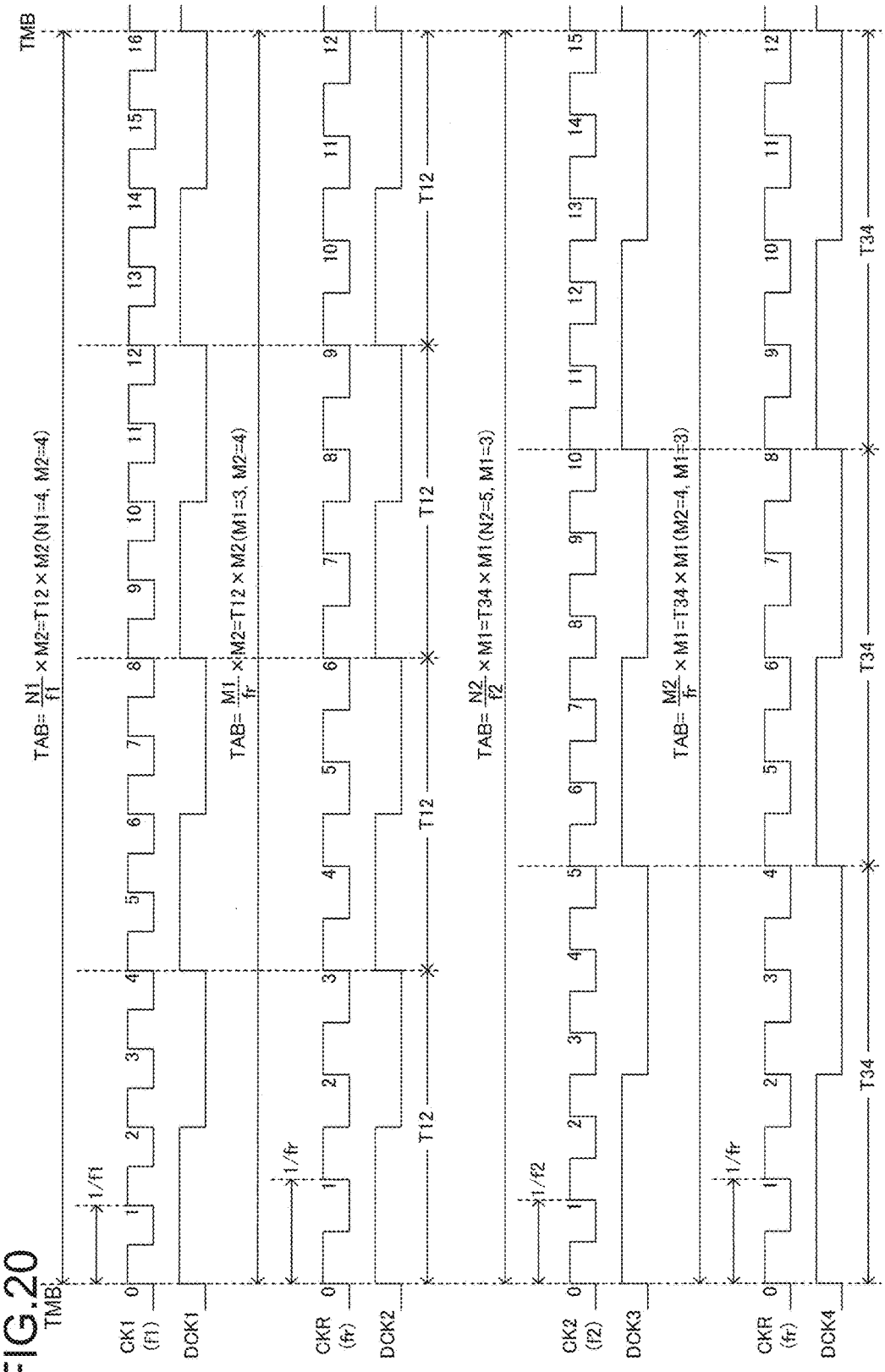
FIG. 20 is a diagram illustrating signal waveforms for describing an operation of another configuration example of the circuit device according to the embodiment.

FIG. 20 is a diagram illustrating signal waveforms for describing an operation of the circuit device 10 in FIG. 19. In FIG. 20, to facilitate the description, setting examples of N1=4, M1=3, N2=5, and M2=4 are illustrated. However, N1, M1, N2, and M2 are actually set to considerably large numbers in order to improve the resolution of the time-to-digital conversion.

As illustrated in FIG. 20, the signal obtained by dividing the clock signal CK1 by N1=4 becomes the divided clock signal DCK1 and the signal obtained by the reference clock signal CKR by division of M1=3 becomes the divided clock signal DCK2. Then, the phases of these signals are synchronized during each period T12. That is, the PLL circuit 120 synchronizes the phases of the clock signal CK1 and the reference clock signal CKR so that a relation of T12=N1/f1=M1/fr is established.

The signal obtained by dividing the clock signal CK2 by N2=5 becomes the divided clock signal DCK3 and the signal obtained by the reference clock signal CKR by division of M2=4 becomes the divided clock signal DCK4. Then, the phases of these signals are synchronized during each period T34. That is, the PLL circuit 130 synchronizes the phases of the clock signal CK2 and the reference clock signal CKR so that a relation of T34=N2/f2=M2/fr is established. In this way, the phases of the clock signal CK1 and the reference clock signal CKR are synchronized for each period T12 and the phases of the clock signal CK2 and the reference clock signal CKR are synchronized for each period T34, so that the phases of the clock signals CK1 and CK2 are synchronized for each period TAB. Here, a relation of TAB=T12×M2=T34×M1 is established. For example, a relation of TAB=T12×4=T34×3 is satisfied in the case of M2=4 and M1=3.

Figures 21, 22:
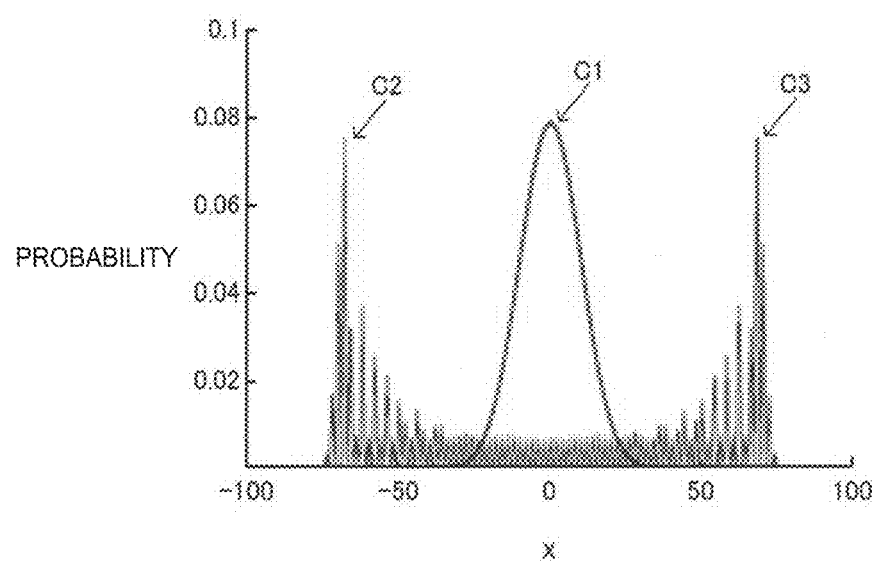
FIG. 21 is a diagram illustrating setting examples of division ratios.
FIG. 22 is a diagram illustrating a random walk and a quantum walk.

The division ratios N1, M1, N2, and M2 of the division circuits 122, 124, 132, and 134 in FIG. 19 are actually set to considerably large numbers. FIG. 21 illustrates setting examples of division ratios. For example, when the clock frequency of the reference clock signal CKR is fr=101 MHz, a division ratio of the division circuits 122 and 124 is set to N1=101 and M1=100. Thus, the clock signal CK1 with f1=102.01 MHz is generated by the PLL circuit 120. A division ratio of the division circuits 132 and 134 is set to N2=102 and M2=101. Thus, the clock signal CK2 with f2=102 MHz is generated by the PLL circuit 130. Thus, the resolution (time resolution) of the time-to-digital conversion described with reference to FIG. 2 can be set to Δt=|1/f1−1/f2|=0.96 picoseconds (ps). Thus, it is possible to achieve the time-to-digital conversion of a considerably high resolution.

As illustrated in FIGS. 21, N1 and M1 are two or more different integers and N2 and M2 are also two or more different integers. At least one of N1 and M1 and at least one of N2 and M2 are different integers. Preferably, the greatest common divisor of N1 and N2 is 1 and the least common multiple of N1 and N2 is N1×N2. The greatest common divisor of M1 and M2 is 1 and the least common multiple of M1 and M2 is M1×M2.

In FIG. 21, a relation of |N1×M2−N2×M1|=1 is established. That is, N1, M1, N2, and M2 are set so that the relation of |N1×M2−N2×M1|=1 is established. For example, when N1=4, M1=3, N2=5, and M2=4 are set in FIG. 20, |N1×M2−N2×M1|=|4×4−5×3|=1 is satisfied. This means that the length of 16 clock signals CK1 is the same as the length of 15 clock signals CK2. In this way, the clock signals CK1 and CK2 deviate by one clock cycle (one clock period) during each period TAB. In this way, it is possible to easily realize the time-to-digital conversion using the principle of a caliper (vernier).

In FIGS. 19 and 20, the phases of the clock signal CK1 and the reference clock signal CKR are synchronized for each the period T12 shorter than the period TAB and the phases of the clock signal CK2 and the reference clock signal CKR are synchronized during each period T34 shorter than the period TAB. Accordingly, an incidence of the phase comparison is greater than in the configuration example of FIG. 14 described above, and thus a reduction in jitter (accumulative jitter) or phase noise of the clock signals CK1 and CK2 is achieved. In particular, when the N1, M1, N2, and M2 are set to large numbers in order to realize Δt of a high resolution, the length of the synchronization period is considerably long in the configuration example of FIG. 14. Thus, errors are integrated and jitter or a phase error may increase. In contrast, in FIGS. 19 and 20, since the phase comparison is performed during each short period T12 or T34, the integrated errors can be reduced. Thus, there is the advantage of improving the jitter or the phase error.

The PLL circuits 120 and 130 in FIG. 19 are configured as analog circuits, but digital (ADPLL) circuit configuration may be adopted. In this case, each PLL circuit (120 and 130) can be realized by a digital arithmetic unit and a phase detector including a counter and TDC. The counter generates digital data equivalent to an integer part of a result obtained by dividing the clock frequency (fr) of the reference clock signal (CKR) by the clock frequency (f1 or f2) of the clock signal (CK1 or CK2). The TDC generates digital data equivalent to a decimal part of the division result. The digital data corresponding to an addition result of the integer part and the decimal part is output to the digital arithmetic unit. The digital arithmetic unit generates frequency control data by detecting a phase error with set frequency data based on the digital data of the comparison result from the set frequency data (FCW1 and FCW2) and the phase detector and performing a process of smoothing the phase error, and then outputs the frequency control data to the oscillation circuits (101 and 102). The oscillation frequency is controlled based on the frequency control data and the oscillation circuit generates the clock signals (CK1 and CK2). Instead of using the TDC, the digital PLL circuit may be realized with a configuration in which a bang-bang type phase detector and PI control are used.

7. Jitter and Resolution

In the embodiment, as described above, time-to-digital conversion with high resolution is realized, but there is a problem that precision corresponding to the high resolution may not be realized due to accumulation of jitter of the clock signals. For example, when jitter is simply white noise, the accumulative jitter is, for example, a random walk. That is, the accumulative jitter which is an accumulative sum is a random walk and has autocorrelation with jitter (white noise) such as absolute noise with no autocorrelation.

For example, the random walk is distributed and converged on a normal distribution (Gauss distribution), as indicated by C1 of FIG. 22. A quantum walk is converged on a given probability density function that has a limited compact support, as indicated by C2 and C3.

For example, in FIG. 8, the phases of the clock signals CK1 and CK2 are synchronized for period TS. As indicated by D1 of FIG. 23, there is jitter at each clock cycle in the clock signals CK1 and CK2. The phases of the clock signals CK1 and CK2 are synchronized during each period TK and D2 is accumulative jitter during the period TK. Here, J is assumed to be a jitter amount per clock cycle of the clock signals CK1 and CK2 and K is assumed to be the number of clocks during the period TK in one of the clock signals CK1 and CK2 (or the reference clock signal). At this time, when a random walk is assumed, an accumulative jitter amount (a jitter integrated error) can be expressed as, for example, $K^{1/2} \times J$. When a quantum walk is assumed, an accumulative jitter amount can be expressed as, for example, $K \times J$.

Here, the jitter amount J represents a deviation in the phase with respect to an ideal clock signal and is expressed with an RMS value and a unit is a time. For example, the jitter amount J is a standard value (maximum standard value) determined in accordance with performance or the like of the oscillation element and is, for example, an RMS value representing a deviation in an average phase per clock. The number of clocks K is the number of clocks (instances) of one clock signal during the period TK between a timing at which the phase of one of the clock signals CK1 and CK2 is synchronized with the phase of the other clock signal or the reference clock signal (CKR) and a timing at which the phases are subsequently synchronized. In the example of FIG. 8, the number of clocks K is equivalent to the numbers of clocks N and M of the clock signals CK1 and CK2. The period TK is equivalent to the period TS of FIG. 8. When f (f1 or f2) is the frequency of one of the clock signals CK1 and CK2 and $\Delta t$ is a resolution of the time-to-digital conversion, $K=1/(f \times \Delta t)$ can be expressed. On the other hand, in the example of FIG. 19, the number of clocks K is equivalent to N1 and N2 of FIG. 21. The period TK is equivalent to the periods T12 and T34 of FIG. 20.

Figure 23:
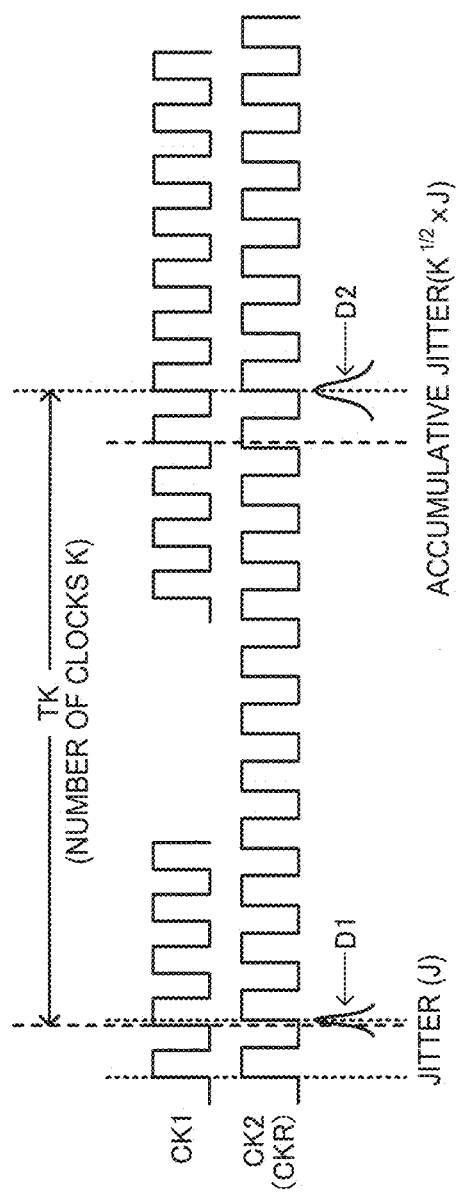
FIG. 23 is a diagram illustrating an accumulative jitter.

As illustrated in FIG. 23, as the number of clocks K during the period TK indicating a phase synchronization interval is larger, an error by the accumulative jitter is larger and the precision may degrade. The meaning is that the number of clocks K during the period TK can be decreased in the configuration example of FIG. 19. Therefore, an error by the accumulative jitter can be reduced and it is possible to improve the precision.

Figure 24:
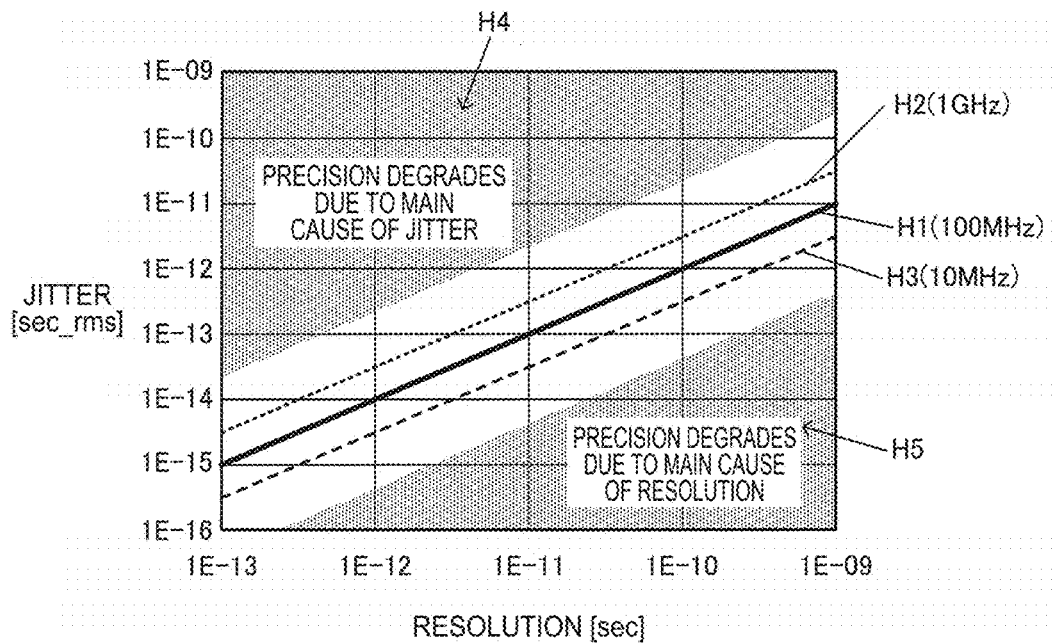
FIG. 24 is a diagram illustrating a relation between resolution and jitter.

H1, H2, and H3 of FIG. 24 indicate a relation between a resolution (sec) and jitter (sec_rms) of a clock signal, for example, when a random walk is assumed. For example, a relation between the resolution and the jitter is indicated when the accumulative jitter amount is expressed as $K^{1/2} \times J$. H1, H2, and H3 are equivalent to cases in which the frequencies of the clock signals (CK1 and CK2) are 100 MHz, 1 GHz, and 10 MHz. In FIG. 24, a region indicated by H4 is a region in which the precision degrades due to the jitter as a main cause. A region indicated by H5 is a region in which the precision degrades due to the resolution as a main cause.

For example, H1 of FIG. 24 indicates a case in which the frequency of the clock signal is 100 MHz and the number of clocks K is about $10^4$. For example, when the resolution ($\Delta t$) is 1 ps ($10^{-12}$ sec) in H1, jitter (J) is 0.01 ps ($10^{-14}$ sec_rms). When $K=10^4$ is set, a relation of $\Delta t = K^{1/2} \times J$ is established. For example, when the frequency of the clock signal is set to be high like 1 GHz, the number of clocks K can be set to be small. Therefore, a line indicating the relation of $\Delta t = K^{1/2} \times J$ is indicated by H2 and a request for the jitter is moderate. Conversely, when the frequency of the clock signal is set to be low like 10 MHz, the number of clocks K increases. Therefore, a line indicating the relation of $\Delta t = K^{1/2} \times J$ is indicated by H3 and a request for the jitter is strict.

In the embodiment, when J is a jitter amount per clock cycle of the clock signals CK1 and CK2 and $\Delta t$ is a resolution of the time-to-digital conversion, at least a relation of $J \leq \Delta t$ is established. For example, H6 of FIG. 25 indicates a line in which a relation of $J = \Delta t$ is established. This line corresponds to a region in which the precision degrades due to the jitter as a main cause, as indicated by H4 of FIG. 24, and indicates an upper limit of the jitter in which the jitter does not exceed at least the resolution. For example, when the resolution ($\Delta t$) is 1 ps ($10^{-12}$ sec), it is requested that the jitter amount J is equal to or less than at least 1 ps ($10^{-12}$ sec_rms) and the jitter amount J is not allowed to be greater than 1 ps (an RMS value). This is because when the jitter amount is greater than 1 ps, setting of the high resolution such as $\Delta t = 1$ ps is meaningless.

In the embodiment, when K is the number of clocks of one clock signal during the period TK between a timing at which the phase of one of the clock signals CK1 and CK2 is synchronized with the phase of the other clock signal or the reference clock signal (CKR) and a timing at which the phases are subsequently synchronized, a relation of $J \geq \Delta t/K$ is established. For example, H7 of FIG. 25 indicates a line in which a relation of $J = \Delta t/K$ is established. This line corresponds to a region in which the precision degrades due to the resolution as a main cause, as indicated by H5 of FIG. 24, and indicates a lower limit of the jitter with respect to the resolution. For example, H7 corresponds to a quantum walk. In this way, when $J \geq \Delta t/K$ is set, a behavior of the accumulative jitter can be treated even when the quantum walk is assumed. An oscillation element with jitter characteristics more than necessary may not be selected.

For example, when f (f1 or f2) is the frequency of the clock signals (CK1 and CK2) and K is the number of clocks during the period TK, $K=1/(f \times \Delta t)$ is established. In the example of FIG. 8, $N=1/(f1 \times \Delta t)$ and $M=1/(f2 \times \Delta t)$ are established. This means that the phases of one of the clock signals (CK1 and CK2) and the other clock signal deviate by one clock cycle for each period TK (TS). Accordingly, when the relation of $J \geq \Delta t/K$ is expressed with the frequency f of the clock signal, a relation of $J \geq f \times \Delta t^2$ is established.

Figure 25:
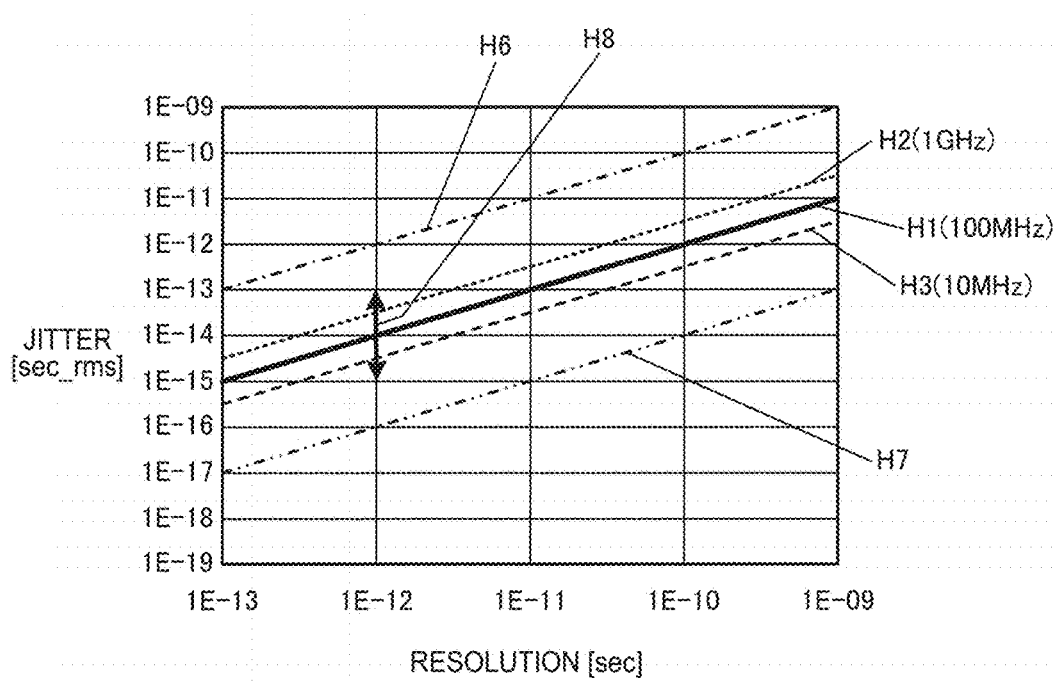
FIG. 25 is a diagram illustrating a relation between resolution and jitter.

In the embodiment, for example, a relation of $(1/10) \times (\Delta t/K^{1/2}) \leq J \leq 10 \times (\Delta t/K^{1/2})$ is established. For example, when the clock frequency is 100 MHz, H1 of FIG. 25 is equivalent to a line of $J=\Delta t/K^{1/2}$. This line is equivalent to a line of a random walk. In this case, for example, in a range indicated by H8 of FIG. 25, the precision does not degrade due to the jitter as a main cause, as indicated by H4 of FIG. 24 and the precision does not degrade due to the resolution as a main cause, as indicated by H5. It is indicated that $(1/10)\times(\Delta t/K^{1/2})\leq J\leq 10\times(\Delta t/K^{1/2})$ is within the range indicated by H8 of FIG. 25 and the relation between the resolution of the jitter is preferably within the range of H8. Since the region in the range of H8 is a region in a boundary of a region in which the accumulative jitter limits the precision and a region in which the resolution limits the precision, the time-to-digital conversion of high precision can be realized even when an oscillation element with over-specification is not employed.

For example, when a random walk is assumed, a relation in which the resolution and the accumulative jitter amount compete with each other can be expressed as $J=\Delta t/K^{1/2}$. As described above, when $K=1/(f\times\Delta t)$ is established, $J=\Delta t/K^{1/2}$ becomes a relation of $J=(f\times\Delta t^3)^{1/2}$. Accordingly, when the frequency f of the clock signal is in the range of 10 MHz to 1 GHz as in FIG. 25, a relation of $(10^7\times\Delta t^3)^{1/2}\leq J\leq(10^9\times\Delta t^3)^{1/2}$ is established. When the frequency f of the clock signal is in the range of 10 KHz to 10 GHz, a relation of $(10^4\times\Delta t^3)^{1/2}\leq J\leq(10^{10}\times\Delta t^3)^{1/2}$.

8. Physical Quantity Measurement Apparatus, Electronic Apparatus, and Vehicle

Figure 26:
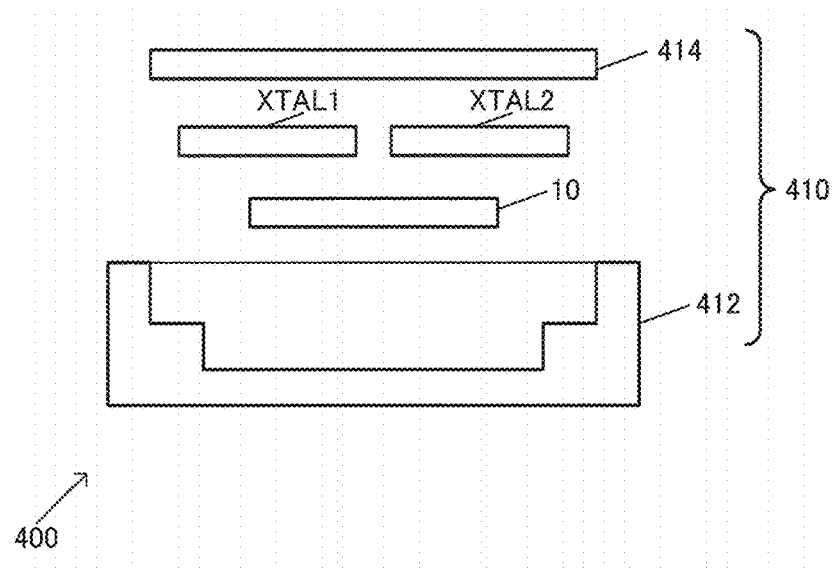
FIG. 26 is a diagram illustrating a configuration example of a physical quantity measurement apparatus.

FIG. 26 illustrates a configuration example of a physical quantity measurement apparatus 400 according to the embodiment. The physical quantity measurement apparatus 400 includes the circuit device 10 according to the embodiment, the oscillation element XTAL1 (the first resonator or a first resonator element) that generates the clock signal CK1, and the oscillation element XTAL2 (the second oscillation element or a second resonator element) that generates the clock signal CK2. The physical quantity measurement apparatus 400 can include a package 410 in which the circuit device 10 and the oscillation elements XTAL1 and XTAL2 are accommodated. The package 410 is configured to include, for example, a base unit 412 and a lid unit 414. The base unit 412 is, for example, a box-like member formed of an insulation material such as ceramics and the lid unit 414 is, for example, a plate-shaped member bonded to the base unit 412. An external connection terminal (external electrode) which is connected to an external apparatus is installed on, for example, the bottom surface of the base unit 412. The circuit device 10 and the oscillation elements XTAL1 and XTAL2 are accommodated in an internal space (cavity) formed by the base unit 412 and the lid unit 414. Then, the circuit device 10 and the oscillation elements XTAL1 and XTAL2 are air-tightly sealed inside the package 410 by being sealed by the lid unit 414.

The circuit device 10 and the oscillation elements XTAL1 and XTAL2 are mounted inside the package 410. Terminals of the oscillation elements XTAL1 and XTAL2 and a terminal (pad) of the circuit device 10 (IC) are electrically connected by an internal wiring of the package 410. The oscillation circuits 101 and 102 oscillating the oscillation elements XTAL1 and XTAL2 are installed in the circuit device 10. The oscillation elements XTAL1 and XTAL2 are oscillated by the oscillation circuits 101 and 102 to generate the clock signals CK1 and CK2.

In the scheme of the related art of the above-described JP-A-5-87954, for example, the first and second oscillation circuits are installed in the first and second quartz crystal oscillators and the circuit device does not contain the first and second oscillation circuits. Therefore, the synchronization of the phases of the first and second clock signals may not be realized by the synchronization circuit 110. In addition, there is the disadvantage that a control process common to the first and second oscillation circuits may not be performed in the circuit device.

Various modifications of the configuration of the physical quantity measurement apparatus 400 can be realized. For example, the base unit 412 may have a plate shape and the lid unit 414 may have a shape in which a depression portion is formed therein. Various modifications of the mounting form or the wiring connection of the circuit device 10 and the oscillation elements XTAL1 and XTAL2 inside the package 410 can also be realized. The oscillation elements XTAL1 and XTAL2 may not necessarily be configured to be completely separated from each other and may be first and second oscillation regions formed in one member. Three or more oscillation elements may be installed in the physical quantity measurement apparatus 400 (the package 410). In this case, three or more oscillation circuits corresponding to the three or more oscillation elements may be installed in the circuit device 10.

Figure 27:
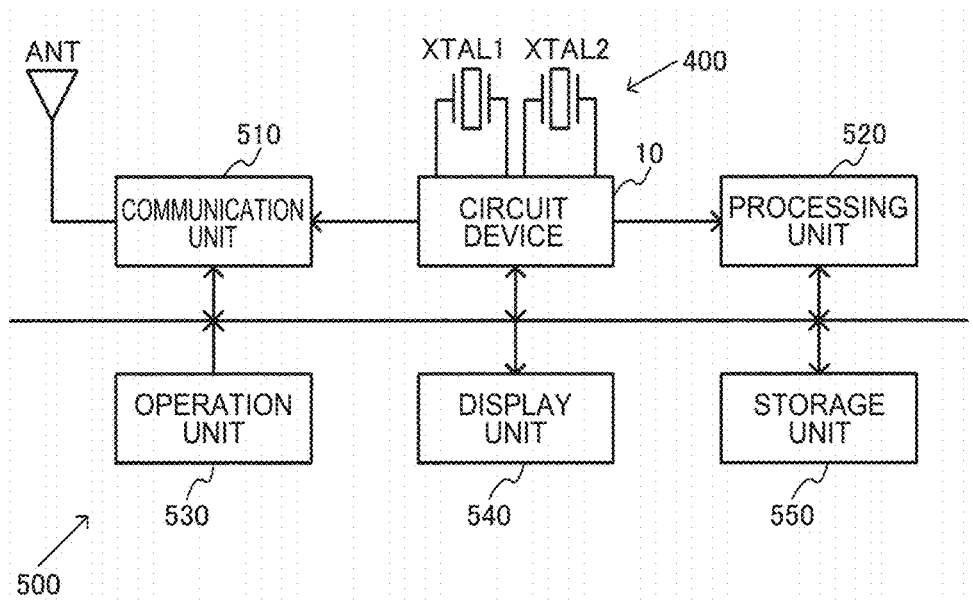
FIG. 27 is a diagram illustrating a configuration example of an electronic apparatus.

FIG. 27 is a diagram illustrating a configuration example of an electronic apparatus 500 including the circuit device 10 according to the embodiment. The electronic apparatus 500 includes the oscillation elements XTAL1 and XTAL2, a processing unit 520, and the circuit device 10 according to the embodiment. The electronic apparatus 500 can also include a communication unit 510, an operation unit 530, a display unit 540, a storage unit 550, and an antenna ANT. The physical quantity measurement apparatus 400 is configured to include the circuit device 10 and the oscillation elements XTAL1 and XTAL2. The electronic apparatus 500 is not limited to the configuration of FIG. 27. Various modifications can be realized in such a manner that some of the constituent elements are omitted or other constituent elements are added.

As the electronic apparatus 500, for example, a measurement apparatus measuring a physical quantity such as a distance, a time, a flow rate, or a flow quantity, a biometric information measurement apparatus (an ultrasonic measurement apparatus, a pulse wave meter, or a blood pressure measurement apparatus) measuring biometric information, an on-vehicle apparatus (an automatic driving apparatus), and a network-related apparatus such as a base station or a router can be considered. A wearable apparatus such as ahead-mounted display apparatus or a watch-related apparatus, a printing apparatus, a projection apparatus, a robot, a portable information terminal (a smartphone, a mobile phone, a portable game apparatus, a notebook type PC, or a tablet PC), a content supply apparatus delivering content, and a video apparatus such as a digital camera or a video camera can also be considered.

The communication unit 510 (wireless circuit) performs a process of receiving data from the outside or transmitting data to the outside via the antenna ANT. The processing unit 520 performs a control process of the electronic apparatus 500 or various digital processes for data transmitted and received through the communication unit 510. The processing unit 520 performs various processes using physical quantity information measured by the physical quantity measurement apparatus 400. The function of the processing unit 520 can be realized by, for example, a processor such as a microcomputer.

The operation unit 530 is a unit with which a user performs an input operation and can be realized by an operation button, a touch panel display, or the like. The display unit 540 displays various kinds of information and can be realized by a liquid crystal or organic EL display. When a touch panel display is used as the operation unit 530, the touch panel display also has functions of the operation unit 530 and the display unit 540. The storage unit 550 stores data and the function of the storage unit 550 can be realized by a semiconductor memory such as a RAM or a ROM or a hard disk drive (HDD).

Figure 28:
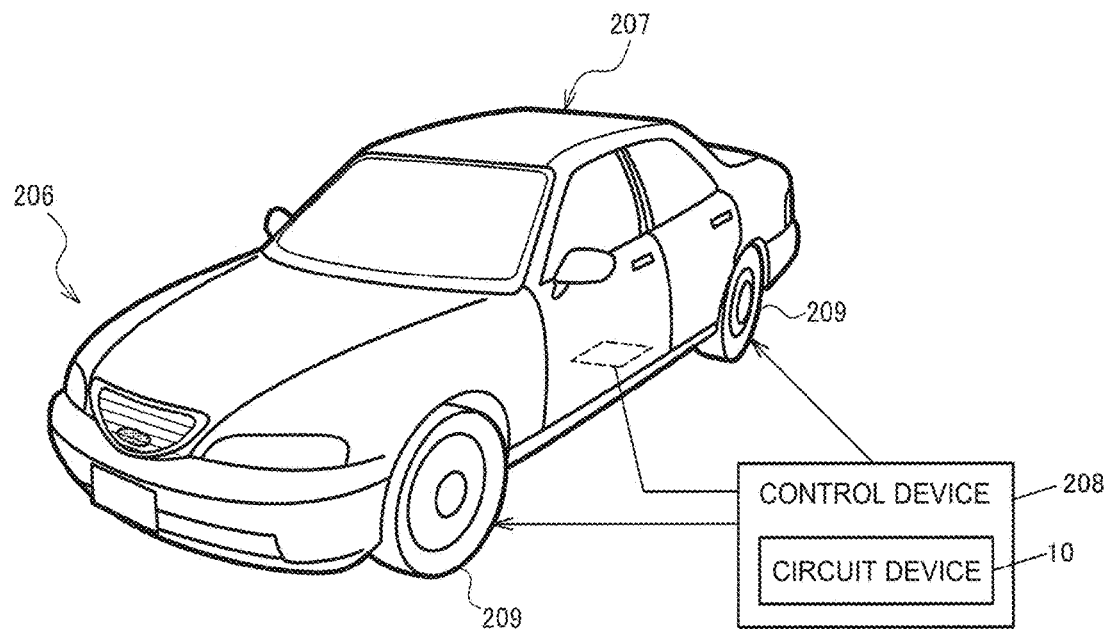
FIG. 28 is a diagram illustrating a configuration example of a vehicle.

FIG. 28 is a diagram illustrating an example of a vehicle including the circuit device according to the embodiment. The circuit device 10 (the oscillator) according to the embodiment can be embedded in, for example, various vehicles such as a car, an airplane, a motorbike, a bicycle, a robot, and a ship. A vehicle is, for example, an apparatus that includes a driving mechanism such as an engine or a motor, a steering mechanism such as a handle or a wheel and various electronic apparatuses (on-vehicle apparatuses) and move on the ground, in the air, or on the sea. FIG. 28 schematically illustrates an automobile 206 as a specific example of the vehicle. The physical quantity measurement apparatus (not illustrated) including the circuit device 10 and the oscillation elements according to the embodiment is embedded in the automobile 206 (vehicle). A control device 208 performs various control processes based on physical quantity information measured by the physical quantity measurement apparatus. For example, when distance information of an object around the automobile 206 is measured as physical quantity information, the control device 208 performs various control processes for automatic driving using the measured distance information. The control device 208 controls relative hardness of a suspension, for example, in accordance with an attitude of a body 207 or controls a brake of an individual car wheel 209. A device in which the circuit device 10 according to the embodiment or the physical quantity measurement apparatus is embedded is not limited to the control device 208, but circuit device 10 or the physical quantity measurement apparatus can be embedded in various devices (on-vehicle devices) installed in a vehicle such as the automobile 206.

The embodiment has been described in detail above, but those skilled in the art easily understand that many modifications can be made without substantially departing from the novelties and advantages of the invention. Accordingly, all the modification examples are included in the scope of the invention. For example, terms (the clock cycle designation value and the like) described along with other broader or identical terms (the clock cycle designation information and the like) in the present specification and the drawings can be replaced with other terms in any portions of the present specification or the drawings at least once. All the combinations of the embodiment and the modification examples are also included in the scope of the invention. The configurations and operations of the circuit device, the physical quantity measurement apparatus, the electronic apparatus, and the vehicle, the time-to-digital conversion process, the first and second signal generation processes, the phase comparison process, and the phase synchronization process are not limited to those described in the embodiment, but various modifications can be made.

The entire disclosure of Japanese Patent Application Nos. 2016-187913 filed Sep. 27, 2016 and 2017-102225 filed May 24, 2017 are expressly incorporated by reference herein.

What is claimed is:

1. A circuit device comprising:
a time-to-digital conversion circuit configured to receive a first clock signal and a second clock signal, and to convert a time difference in transition timings of first and second signals into a digital value, the first clock signal having a first clock frequency, the second clock signal having a second clock frequency, the second clock frequency being a different frequency than the first clock frequency; and
a synchronization circuit configured to synchronize phases of the first and second clock signals input to the time-to-digital conversion circuit,
wherein the time-to-digital conversion circuit is configured to calculate the digital value corresponding to the time difference by transitioning a signal level of the first signal based on the first clock signal after a phase synchronization timing of the first and second clock signals and to compare the phase of the second clock signal to a phase of the second signal having a signal level transitioned to correspond to the first signal.

2. The circuit device according to claim 1,
wherein the time-to-digital conversion circuit is configured to transition the signal level of the first signal at each clock cycle of the first clock signal after the phase synchronization timing.

3. The circuit device according to claim 2,
wherein the time-to-digital conversion circuit is configured to calculate the digital value corresponding to the time difference by comparing the phases of the second clock signal and the second signal having the signal level transitioned to correspond to the first signal at each clock cycle of the first clock signal.

4. The circuit device according to claim 1,
wherein the synchronization circuit is configured to synchronize the phases of the first and second clock signals at each phase synchronization timing.

5. The circuit device according to claim 1,
wherein the time-to-digital conversion circuit is configured to calculate the digital value corresponding to the time difference by specifying a timing at which a phase anteroposterior relation between the second signal and the second clock signal is switched when the signal level of the first signal is transitioned based on the first clock signal and the signal level of the second signal is transitioned to correspond to the first signal after the phase synchronization timing.

6. The circuit device according to claim 1,
wherein the time-to-digital conversion circuit is configured to perform time-to-digital conversion with a resolution corresponding to a frequency difference between the first and second clock frequencies.

7. The circuit device according to claim 1,
wherein the time-to-digital conversion circuit is configured to perform time-to-digital conversion at a resolution $\Delta t$ when a time difference between transition timings of the first and second clock signals at an i-th clock cycle after the phase synchronization timing is at an inter-clock time difference $TR=i\times\Delta t$.

8. The circuit device according to claim 7,
wherein the time-to-digital conversion circuit is configured to calculate a digital value corresponding to an inter-clock time difference $TR=j\times\Delta t$ as the digital value corresponding to the time difference when a phase anteroposterior relation between the second signal and the second clock signal is switched at a j-th clock cycle after the phase synchronization timing.

9. The circuit device according to claim 1,
wherein in the time-to-digital conversion circuit, the first clock signal is a clock signal generated employing a first resonator and the second clock signal is a clock signal generated employing a second oscillation element.

10. The circuit device according to claim 1,
wherein the time-to-digital conversion circuit includes a signal output circuit that outputs the first signal at each clock cycle of the first clock signal based on the first clock signal.

11. The circuit device according to claim 1,
wherein the time-to-digital conversion circuit includes a counter,
a count value of the counter being maintained as-is when a signal of a result of the phase comparison of the second signal and the second clock signal is at a first voltage level,
the count value of the counter is updated when the signal of the result of the phase comparison is at a second voltage level, and
the time-to-digital conversion circuit calculates the digital value corresponding to the time difference based on the count value of the counter.

12. The circuit device according to claim 1,
wherein the time-to-digital conversion circuit is configured to compare the phases of the second signal and the second clock signal by sampling, based on one of the second signal and the second clock signal, the other of the second signal and the second clock signal.

13. The circuit device according to claim 1,
wherein the synchronization circuit includes a first PLL circuit configured to synchronize phases of the first clock signal and a reference clock signal and a second PLL circuit configured to synchronize the phases of the second clock signal and the reference clock signal.

14. The circuit device according to claim 1,
wherein J is a jitter amount per clock cycle of the first and second clock signals,
$\Delta t$ is a resolution of time-to-digital conversion, and
$J \leq \Delta t$.

15. The circuit device according to claim 14,
wherein the number of clocks of one of the first and second clock signals during a period between a timing at which a phase of the one clock signal is synchronized with a phase of the other clock signal or a reference clock signal and a timing at which the phases are subsequently synchronized is K, and
$J \geq \Delta t/K$.

16. The circuit device according to claim 14,
wherein the number of clocks of one of the first and second clock signals during a period between a timing at which a phase of the one clock signal is synchronized with a phase of the other clock signal or a reference clock signal and a timing at which the phases are subsequently synchronized is K, and
$(1/10) \times (\Delta t/K^{1/2}) \leq J \leq 10 \times (\Delta t/K^{1/2})$.

17. A physical quantity measurement apparatus comprising:
a circuit device including:
a time-to-digital conversion circuit configured to receive a first clock signal and a second clock signal, and to convert a time difference in transition timings of first and second signals into a digital value, the first clock signal having a first clock frequency, the second clock signal having a second clock frequency, the second clock frequency being a different frequency than the first clock frequency; and
a synchronization circuit configured to synchronize phases of the first and second clock signals input to the time-to-digital conversion circuit,
wherein the time-to-digital conversion circuit is configured to calculate the digital value corresponding to the time difference by transitioning a signal level of the first signal based on the first clock signal after a phase synchronization timing of the first and second clock signals and to compare the phase of the second clock signal to a phase of the second signal having a signal level transitioned to correspond to the first signal;
a first resonator that generates the first clock signal; and
a second oscillation element that generates the second clock signal.

18. The physical quantity measurement apparatus according to claim 17,
wherein the time-to-digital conversion circuit is configured to transition the signal level of the first signal at each clock cycle of the first clock signal after the phase synchronization timing.

* * * * *